United States Patent [19]
Kaneko et al.

[11] Patent Number: 5,654,651
[45] Date of Patent: Aug. 5, 1997

[54] CMOS STATIC LOGIC CIRCUIT

[75] Inventors: Kenji Kaneko, Sagamihara; Makoto Hanawa, Niiza; Kentaro Shimada, Kokubunji; Kazunori Nakajima, Hadano, all of Japan

[73] Assignee: Hitachi, Ltd., Tokyo, Japan

[21] Appl. No.: 544,730

[22] Filed: Oct. 18, 1995

[30] Foreign Application Priority Data

Oct. 18, 1994 [JP] Japan .................... 6-251778

[51] Int. Cl.⁶ .................................................. H03K 19/20
[52] U.S. Cl. ........................................ 326/121; 326/17
[58] Field of Search ............................ 326/121, 104, 326/83, 17

[56] References Cited

U.S. PATENT DOCUMENTS

| | | | |
|---|---|---|---|
| 4,613,772 | 9/1986 | Young | 326/121 |
| 4,621,207 | 11/1986 | Suganuma | 326/121 |
| 4,649,296 | 3/1987 | Shoji | 326/121 |
| 5,001,367 | 3/1991 | Vinal | 326/121 |
| 5,352,939 | 10/1994 | Hirabayishi | 326/83 |

FOREIGN PATENT DOCUMENTS 2-277315  11/1990  Japan .

OTHER PUBLICATIONS

Kan M. Chu and David L. Pulfrey, A Comparison of CMOS Circuit Techniques: Differntial Cascode Voltage Switch Logic Versus Conventional Logic; IEEE Journal of Solid–State Circuits, vol. SC–22, No. 4, Aug. 24, 1987, pp. 528–532.

*Primary Examiner*—Edward P. Westin
*Assistant Examiner*—Benjamin D. Driscoll
*Attorney, Agent, or Firm*—Antonelli, Terry, Stout & Kraus, LLP.

[57] ABSTRACT

A static logic circuit employs pull-down type logic gates having logic transistors forming a power supply current path and logic transistors forming a grounding current path and having current drive abilities higher than those of the logic transistors forming the power supply current path, and pull-up type logic gates having logic transistors forming a power supply current path and logic transistors forming a grounding current path and having current drive abilities lower than the logic transistors forming the power supply current path, and comprises logic series formed by alternately cascading the two types of the logic gates. The static logic circuit is provided with signal merged logic circuits each of which provides a signal having a high speed falling transient and a high speed rising transient by merging the output signals of the logic series.

18 Claims, 12 Drawing Sheets

CMOS STATIC LOGIC CIRCUIT

BACKGROUND OF THE INVENTION

The present invention relates to a static logic circuit and, more particularly, to improvements in a static logic circuit suitable for application to large-scale semiconductor integrated circuits.

Generally, a static logic circuit is constructed by connecting a plurality of logic gates comprising static operation type transistors for logical operation in a cascade connection. Each logic gate comprises a plurality of pairs of logic transistors having control terminals connected to each other to form input terminals, grounding current paths, i.e., current paths between output and ground terminals, each formed by connecting the other two terminals of one of the pair of transistors between an output terminal and a ground terminal in a series connection, a parallel connection or a series-parallel connection, and supply current paths, i.e., current paths between output and voltage supply terminals, each formed by connecting the other two terminals of the other one of the pair of transistors between an output terminal and a voltage supply terminal in a series connection, a parallel connection or a series-parallel connection. Each logic gate makes one of the grounding current path and the supply current path conductive and the other nonconductive according to the level of an input signal applied to the input terminal of the pair of transistors.

CMOS (complementary metal oxide semiconductor) logic circuits, which are typical static logic circuits, are widely used logic circuits because a supply current flows through CMOS logic circuits only when the input signal changes and no supply current flows through the same until the next change of the input signal and hence there is less power consumption with CMOS logic circuits (Kan M. Chu, et al., "A Comparison of CMOS Circuit Techniques", IEEE, Vol. SC-22, No. 4, pp. 528–532, August 1987).

The current drive ability of the pMOS transistor of a CMOS transistor used as a logical element in a CMOS logic circuit is about half that of the nMOS transistor of the same size. Therefore, the pMOS transistor is formed in an area about twice that of the nMOS transistor to equalize their current drive abilities so that the rise time and the fall time of the output signals are within an allowable range. Consequently, the parasitic capacitance of the pMOS transistor, principally junction capacitance, i.e., static capacitance parasitic on the drain electrode or the source electrode and gate capacitance, is about twice that of the nMOS transistor and the large parasitic capacitance of the pMOS transistor reduces switching speed. The reduction of the parasitic capacitance and the enhancement of the current drive ability conflict with each other; the current drive ability is reduced when the parasitic capacitance is reduce to enhance the switching speed, and the parasitic capacitance increases when the current drive ability is enhanced. Since the CMOS logic circuit needs the same number of pMOS transistors having a circuit area about twice that of nMOS transistors as that of nMOS transistors, it is difficult to form the CMOS logic circuit in a less circuit area. A method proposed in JP-A No. 2-277315 proposed as a means for improving the switching speed of a CMOS logic circuit connects a precharging MOS transistor to the output terminal. This method of improving the switching speed of a CMOS logic circuit is intended to control the rise and fall of a signal on the output terminal by charging and discharging according to a clock signal. However, there is the possibility that the logic MOS transistor becomes conductive during a precharging period and a high current flows through the transistor across the voltage supply terminal and the ground terminal. Therefore, the CMOS logic circuit needs a MOS transistor to prevent the current in addition to the precharging MOS transistor, which further increases the circuit area. Furthermore, the effect of this method in enhancing the switching speed is not satisfactory because the transistor for preventing the current increases the resistance of the circuit and repetition of charging and discharging in each clock period increases power consumption significantly.

SUMMARY OF THE INVENTION

Accordingly, it is a principal object of the present invention to solve the aforesaid problems in the prior art and to provide an improved static logic circuit capable of operating at an enhanced switching speed with less power consumption.

The aforesaid subject of the present invention can be effectively solved by employing logic gates each comprising logic transistors forming a grounding current path, and logic transistors forming a supply current path and having current drive abilities lower than those of the logic transistors forming the grounding current path (hereinafter referred to as "pull-down type logic gate"), and logic gates each comprising logic transistors forming a supply current path, and logic transistors forming a grounding current path and having current drive abilities lower than those of the logic transistors forming the supply current path (hereinafter referred to as "pull-up logic gate"), and constructing a desired logic network by alternately connecting the two types of logic gates in a cascade connection.

The effect of the present invention as applied to a CMOS logic circuit comprising logic series each having a grounding current path formed of nMOS transistors, and a supply current path formed of pMOS transistors will be described below. Generally, the falling transient of a signal on the output terminal of each logic gate occurs when at least one of the grounding current paths becomes conductive and the charge stored in a load capacitance on the side of the output terminal is discharged through the conductive grounding current path. The rising transient of a signal on the output terminal of each logic gate occurs when at least one of the supply current paths becomes conductive and charge is stored in a load capacitance on the side of the output terminal through the conductive supply current path. Therefore, the fall time or the rise time (delay time) of the output signal is dependent on the product (time constant)of the working resistance (inversely proportional to the current drive ability) of the transistor participating in charging and discharging, i.e., the nMOS transistor or the pMOS transistor, and the load capacitance on the side of the output terminal. The load capacitance that affects charging and discharging substantially is the junction capacitance of the MOS transistors of each logic gate and the gate capacitance of the MOS transistors of the logic gate of the next stage.

The pull-down type logic gate among CMOS logic gates can be realized by using nMOS transistors forming a grounding current path and having a predetermined reference current drive ability, and pMOS transistors forming a supply current path and having a current drive ability lower than that of the nMOS transistor. The pull-up type logic gate can be realized by using pMOS transistors forming a supply current path and having a predetermined reference current drive ability and nMOS transistors forming a grounding current path and having a current drive ability lower than that of the pMOS transistor.

The size of the pull-down type logic gate is reduced by employing the pMOS transistors having a lower current drive ability and the load capacitance on the side of the output terminal is reduced accordingly. Consequently, the discharging time for discharging the stored charge through the nMOS transistors is shortened and the speed of falling transient of the output signal is increased. However, since the increase of the operating resistance cancels out the reduction of the load capacitance is due to the reduction of the size of the pMOS transistors, practically, the rise time of the output signal changes scarcely. The size of the pull-up type logic gate is reduced by employing the nMOS transistors having a reduced current drive ability and the load capacitance on the side of the output terminal is reduced accordingly. Consequently, the charging time for charging through the pMOS transistors is shortened and the speed of rising transient of the output signal is increased. However, since the increase of the operating resistance cancels out the reduction of the load capacitance achieved by the reduction of the size of the nMOS transistors, practically, the fall time of the output signal changes scarcely.

When a desired logic network is constructed by alternately connecting pull-down type logic gates and pull-up type logic gates in a cascade connection, the logic gate of each stage inverts the phase of the input signal. Therefore, the logic gate of each stage gives an output signal produced by increasing the speed of transient corresponding to only either the falling transient or the rising transient of an input signal given to the logic gate of the first stage to the logic gate of the next stage. When a pair of logic series having stages of logic gates having the same logical functions to those of the logic gates of the corresponding stages are employed, the pull-down logic gate is disposed in the first stage of one of the pair of logic series and a pull-up type logic gate is disposed in the first stage of the other logic series, and the same input signal is applied to the logic gates of the respective first stages of the two logic series, an output signal having high speed falling transient can be obtained at an output terminal of the one logic gate of the last stage and an output signal having high speed rising transient can be obtained at an output terminal of the other logic gate of the last stage. When the two types of output signals are merged, a merged output signal having both the high speed falling transient and the rising transient can be provided by selecting only the higher speed of the transients of the output signals of the logic gates of the last stage.

Although the effect of the present invention has been described as applied to the CMOS logic circuit, naturally, the present invention is not limited in its application to the CMOS logic circuit and is applicable to static logic circuits employing ordinary junction FETs (field effect transistors) or bipolar transistors.

These and other objects and many of the attendant advantages of the invention will be readily appreciated as the same becomes better understood by reference to the following detailed description when considered in connection with the accompanying drawings.

BRIEF DESCRIPTION OF THE DRAWINGS

FIG. 1b is a signal waveform chart of assistance in explaining the operation of the logic circuit of FIG. 1a;

FIG. 2b is a signal waveform chart of assistance in explaining the operation of the logic series of FIG. 2a;

FIG. 3a is a circuit diagram of a signal merged logic circuit for merging the signals provided by the logic series of FIG. 2a;

FIG. 3b is a signal waveform chart of assistance in explaining the operation of the signal merged logic circuit of FIG. 3a;

FIG. 4a is a circuit diagram of another signal merged logic circuit for merging signals provided by the logic series of FIG. 2a;

FIG. 4b is a signal waveform chart of assistance in explaining the operation of the signal merged logic circuit of FIG. 4a;

FIG. 4c is a circuit diagram of a third signal merged logic circuit for merging signals provided by the logic series of FIG. 2a;

FIG. 5a is a circuit diagram of a circuit for improving the delay time in signal transient of the logic series of FIG. 2a;

FIG. 5b is a signal waveform chart of assistance in explaining the operation of the improved circuit of FIG. 5a;

FIG. 8b is a signal waveform chart of assistance in explaining the operation of the signal merged logic circuit of FIG. 8a;

FIG. 9b is a signal waveform chart of assistance in explaining the operation of the signal merged logic circuit of FIG. 9a;

FIG. 10b is a signal waveform chart of assistance in explaining the operation of the signal merged logic circuit of FIG. 10a;

FIG. 11b is a signal waveform chart of assistance in explaining the operation of the improving means of FIG. 11a;

FIG. 12b is a signal waveform chart of assistance in explaining the operation of the logic circuit of FIG. 12a;

FIG. 13a is a circuit diagram of a modification of the logic circuit of FIG. 11a; and FIG. 13b is a signal waveform chart of assistance in explaining the logic circuit of FIG. 13a.

DETAILED DESCRIPTION OF THE PREFERRED EMBODIMENTS

Static logic circuits in preferred embodiments according to the present invention will be described in detail hereinafter with reference to the accompanying drawings.

EMBODIMENT 1

Figure 1A:
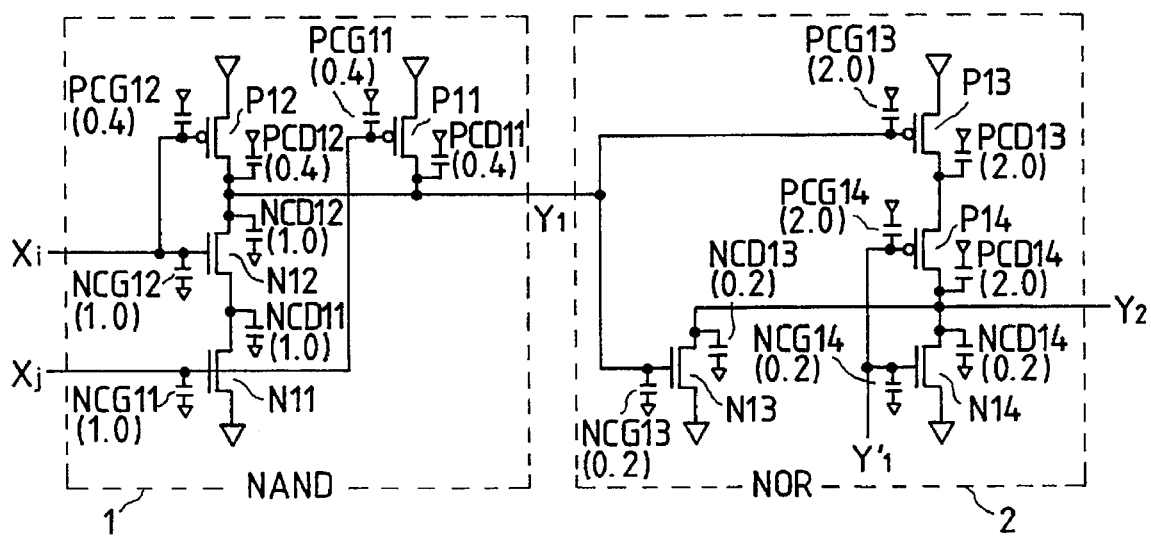
FIG. 1a is a circuit diagram of a logic circuit in a first embodiment according to the present invention.
Figure 1B:
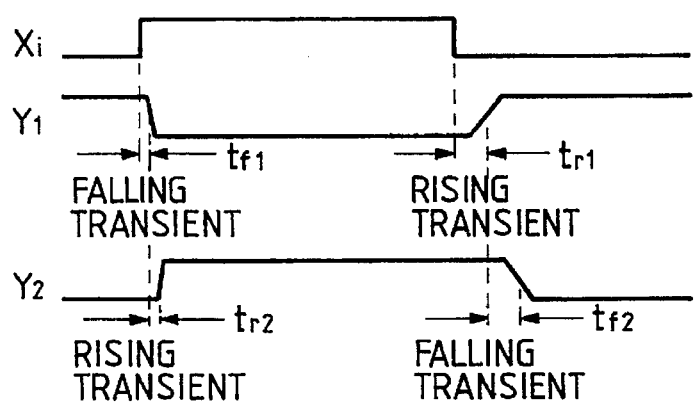

A CMOS logic circuit in a first embodiment according to the present invention is shown in FIGS. 1a and 1b. As shown in FIG. 1a, the logic circuit in this embodiment comprises a front logic gate 1 (serving as a pull-down type logic gate), and a back logic gate 2 (serving as a pull-up type logic gate), arranged in two stages. The front logic gate 1 comprises two logic nMOS transistors N11 and N12 connected in series to form a grounding current path, and two logic pMOS transistors P11 and P12 connected in parallel to form a supply current path. Both the current paths are separate current paths extending between an output terminal and a grounding terminal, or between an output terminal and a power supply terminal. The respective control terminals (gate terminals) of the nMOS transistor N11 of the grounding current path and the pMOS transistor P11 of the supply current path are interconnected to form a first input terminal, the respective control terminals of the nMOS transistor N12 of the grounding current path and the pMOS transistor P12 of the supply current path are interconnected to form a second input terminal.

The back logic gate 2 that serves as a pull-up type logic gate comprises two logic nMOS transistors N13 and N14 connected in parallel to form a grounding current path, and two logic pMOS transistors P13 and P14 connected in series to form a supply current path. These network circuits, similar to those of the front logic gate 1, form separate current paths between the output terminal and the grounding terminal, or between the output terminal and the supply terminal. The respective control terminals of the nMOS transistor N13 of the grounding current path and the pMOS transistor P13 of the supply current path are interconnected to form a first input terminal, and the respective control terminals of the other nMOS transistor N14 of the grounding current path and the other pMOS transistor P14 of the supply current path are interconnected to form a second input terminal. The first input terminal and the second input terminal of the back logic gate 2 are connected to the output terminal of the front logic gate 1 and the output terminal of, for example, another pull-down logic gate, not shown, respectively.

In the CMOS logic circuit in this embodiment, the nMOS transistors N11 and N12 of the front logic gate 1 and the pMOS transistors P13 and P14 of the back logic gate 2 are the same in current drive ability. The current drive ability of the pMOS transistors P11 and P12 of the front logic gate 1 is 1/5 the current drive ability of the nMOS transistors N11 and N12 of the same logic gate 1. The current drive ability of the nMOS transistors N13 and N14 of the back logic gate 2 is 1/5 the current drive ability of the pMOS transistors P13 and P14 of the same logic gate 2.

Generally, the current drive ability of a pMOS transistor is 1/2 the current drive ability of a nMOS transistor of the same area. Therefore, when the current drive abilities of the MOS transistors of the logic gates 1 and 2 are determined as mentioned above, the area of the pMOS transistors P13 and P14 of the back logic gate 2 is twice the area of the nMOS transistors N11 and N12 of the front logic gate 1, the area of the pMOS transistors P11 and P12 of the front logic gate 1 is 2/5 the area of the nMOS transistors N11 and N12 of the same logic gate 1, the area of the nMOS transistors N13 and N14 of the back logic gate 2 is 1/10 the area of the pMOS transistors P13 and P14 of the same logic gate 2 (1/5 the area of the nMOS transistors N11 and N12 of the front logic gate 1). Consequently, the parasitic capacitances (junction capacitances NCD and PCD and gate capacitance NCG), as against the parasitic capacitances of the nMOS transistors N11 and N12 (front logic gate) as a standard (1.0), of the pMOS transistors P11 and P12 (front logic gate), the pMOS transistors P13 and P14 (back logic gate) and the nMOS transistors 13 and N14 (back logic gate) are 0.4, 2.0 and 0.2, respectively. These values are examples only and may be changed.

In the CMOS logic circuit in this embodiment, the front logic gate 1 and the back logic gate 2 function as an NAND circuit and a NOR circuit, respectively. The front logic gate 1 executes a logical operation on the basis of input signals $X_i$ and $X_j$ applied to the two input terminals, respectively, and provides an output signal $Y_1$ at its output terminal. The back logic gate 2 executes a logical operation on the basis of an input signal, i.e., the output signal $Y_1$, applied to the first input terminal and another input signal $Y'_1$ applied to the second input terminal, and provides an output signal $Y_2$ at its output terminal.

When the levels of both the input signals $X_i$ and $X_j$ to the front logic gate 1 are high, both the nMOS transistors N11 and N12 become conductive, and the pMOS transistors P11 and P12 become nonconductive; consequently, the charge on the output terminal is discharged and the output signal $Y_1$ becomes low level. When the level of at least one of the input signals $X_i$ and $X_j$ is low, either of the nMOS transistor N11 and N12, that received the low-level input signal becomes nonconductive, and either of the pMOS transistors P11 and P12, that received the low-level input signal becomes conductive; consequently, the output terminal is charged and the output signal $Y_1$ becomes high level. In this embodiment, since the transistors of the front logic gate 1 have the aforesaid current drive abilities and the parasitic capacitances, respectively, the output signal $Y_1$ falls quickly and rises slowly as shown in FIG. 1b.

In the back logic gate 2, when at least either of the two input signals, i.e., the output signal $Y_1$ of the front logic gate 1 and the input signal $Y'_1$, either of the nMOS transistors N13 and N14, that received the high-level input signal becomes conductive, and either of the pMOS transistors P13 and P14, that received the high-level signal becomes nonconductive; consequently, the charge on the output terminal is discharged and the output signal $Y_2$ becomes low level. When the levels of both the two input signals $Y_1$ and $Y'_1$ are low, both the nMOS transistors N13 and N14 become nonconductive, and both the pMOS transistors P13 and P14 become conductive; consequently, the output terminal is charged and the output signal $Y_2$ becomes high level. In this embodiment, since the transistors of the back logic gate 2 have the aforesaid current drive abilities and the parasitic capacitances, respectively, the output signal $Y_2$, contrary to the output signal $Y_1$ of the front logic gate 1, rises quickly and falls slowly as shown in FIG. 1b.

In the CMOS logic circuit explained above, the front logic gate 1 is a pull-down type logic gate having an NAND function, and the back logic gate 2 is a pull-up type logic gate having a NOR function. However, the front logic gate 1 becomes a pull-up type logic gate having an NAND function when the relation between the current drive abilities in the front logic gate 1 is inverted, and the back logic gate 2 becomes a pull-up type logic gate having a NOR function when the relation between the current drive abilities in the back logic gate 2 is inverted.

Figure 2A:
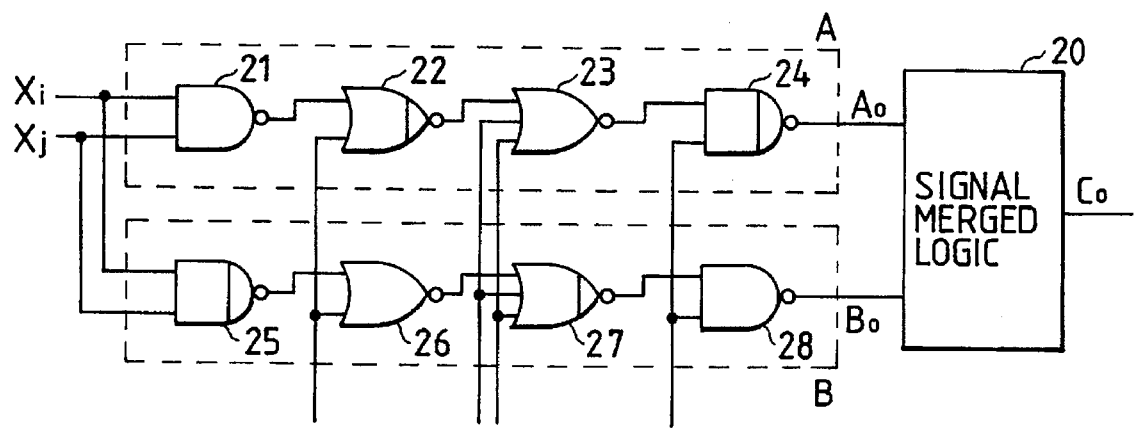
FIG. 2a is a circuit diagram of logic series constructed by connecting the logic circuits of FIG. 1a in a cascade connection.
Figure 2B:
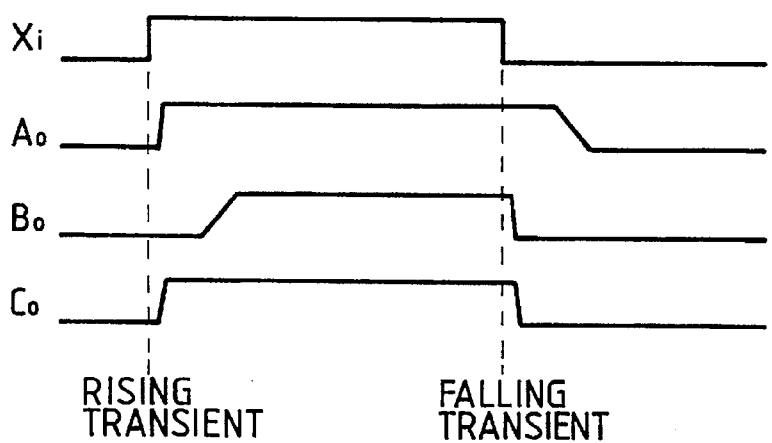

FIG. 2a shows a logic series constructed by using these four types of logic gates, and FIG. 2b is a waveform chart of assistance in explaining the operation of the logic series of FIG. 2a. The logical operation functions of the logic gates of each stage of a pair of logic series correspond to each other. The respective output signals of the two logic series are merged, and an output signal having a short rise time and a short fall time is provided by processing input signals applied to the logic gates of the first stage. Referring to FIG. 2a, a logic series A is formed by cascading a pull-down type logic gate 21 having an NAND function, a pull-up type logic gate 22 having a NOR function, a pull-down type logic gate 23 having a NOR function, and a pull-up type logic gate 24 having an NAND function. A logic series B is formed by cascading a pull-up type logic gate 25 having an NAND function, a pull-down type logic gate 26 having a NOR function, a pull-up type logic gate 27 having a NOR function, and a pull-down type logic gate 28 having an NAND function. The, respective output terminals of the logic series A and B are connected to a signal merged logic circuit 20.

When the same input signals $X_i$ and $X_j$ are given to the logic gates of the first state of the series A and B, respectively, the logic series A provides a signal $A_o$ having a short rise time and the logic series B provides a signal $B_o$ having a short fall time. The signal merged logic circuit 20 employs a logic circuit having a function to select and provide only signals having fast signal transient. As shown in FIG. 2b, the signal merged logic circuit 20 transfers only the signal $A_o$ when the signals $A_o$ and $B_o$ are in a rising transient and transfers only the signal $B_o$ when the signals $A_o$ and $B_o$ are in a falling transient to provide an output signal $C_o$ having short rising and falling transients. The use of the signal merged logic circuit 20 enabled the generation of the output signal $C_o$ quickly responding to the rising transient and falling transient of the input signals $X_i$ and $X_j$.

Figure 3A:
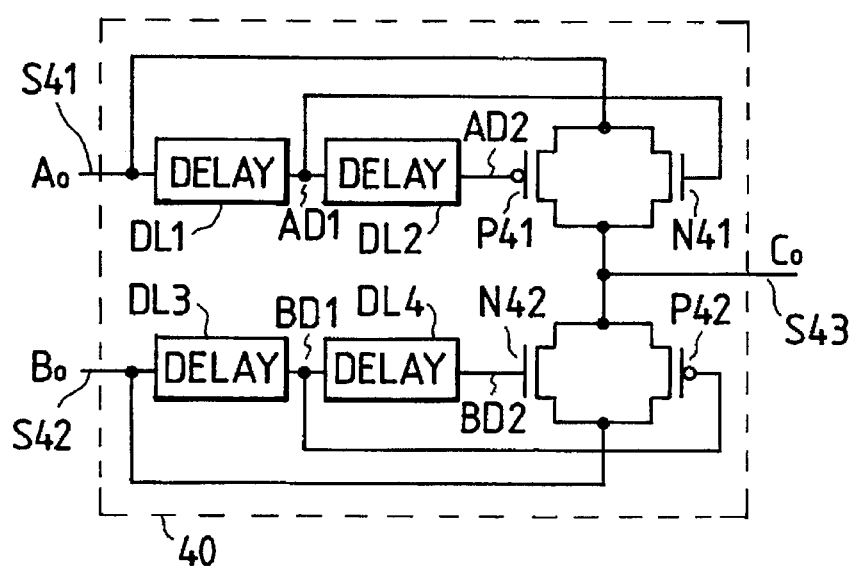
Figure 3B:
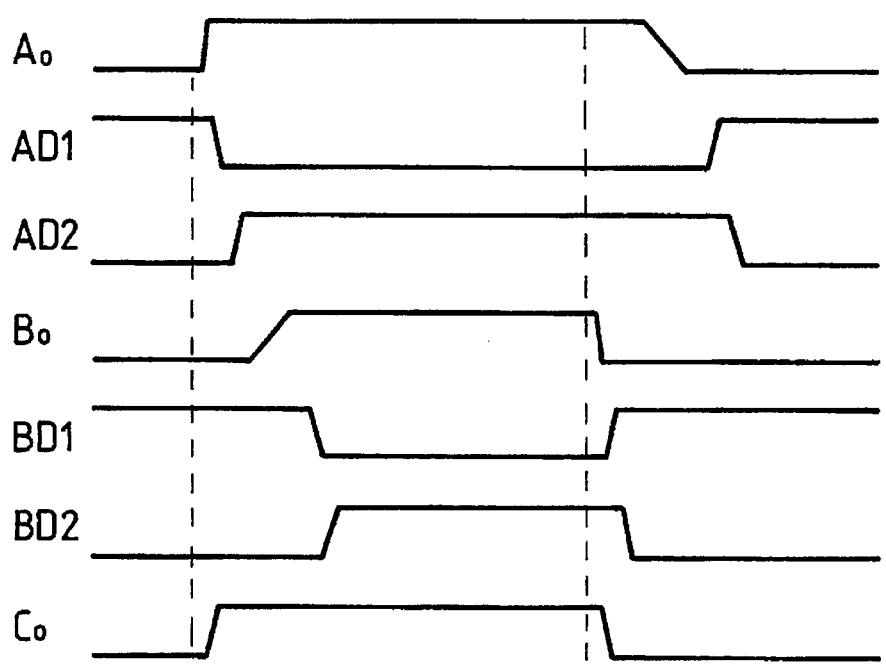

FIG. 3a shows the concrete configuration of the signal merged logic circuit 20 and FIG. 3b is a waveform chart of assistance in explaining the operation of the signal merged logic circuit 20. Referring to FIG. 3a, there are shown delay circuits DL1 to DL4 respectively including inverters, a signal selector pMOS transistor P41 and a signal selector nMOS transistor N41 interconnecting an input terminal S41 to which the signal $A_o$ is applied and an output terminal S43 at which the output signal $C_o$ is provided, and a signal selector pMOS transistor P42 and a signal selector nMOS transistor N42 interconnecting an input terminal S42 to which the signal $B_o$ is applied and the output terminal S43. The delay circuits DL1 and DL2 are connected in a series connection across the input terminal S41 and the gate electrode of the pMOS transistor P41, and the gate electrode of the nMOS transistor N41 is connected to the junction of the delay circuits DL1 and DL2. The delay circuits DL3 and DL4 are connected in a series connection across the input terminal S42 and the gate electrode of the nMOS transistor N42, and the gate electrode of the pMOS transistor P42 is connected to the junction of the delay circuits DL3 and DL4.

The operation of the signal merged logic circuit 20 will be described with reference to the waveform chart of FIG. 3b. Since each of the delay circuits includes an inverter, the level of a delayed signal AD1 provided by the delay circuit DL1 is high, and the level of a delayed signal AD2 provided by the delay circuit DL2 is low when the level of the signal $A_o$ is low. Consequently, the pMOS transistor P41 and the nMOS transistor N41 become conductive to transfer the signal $A_o$ to the output terminal S43 and the output signal $C_o$ becomes low level. When the signal $A_o$ becomes high level quickly, the pMOS transistor P41 and the nMOS transistor N41 remain conductive while the delayed signal AD1 is held high-level and the delayed signal AD2 is held low-level, the rising transient of the signal $A_o$ is transferred to the output terminal S43 and the output signal $C_o$ rises quickly. The rising transient to high-level is due to the charging of the capacitance of the output terminal S43. Upon the elapse of the delay time, the pMOS transistor P41 and the nMOS transistor N41 become nonconductive.

When the level of the signal $B_o$, similarly to the signal $A_o$, is low, the level of the delayed signal BD1 provided by the delay circuit DL3 is high and the delayed signal BD and the level of the delayed signal BD2 provided by the delay circuit DL4 is low. Consequently, the pMOS transistor P42 and the nMOS transistor N42 become nonconductive. When the signal $B_o$ rises and becomes high level with a delay after the signal $A_o$ has become high level, the rising transient of the signal $B_o$ is not transferred to the output terminal S43 because the pMOS transistor P42 and the nMOS transistor N42 remains nonconductive during the delay time. Upon the elapse of the delay time, the pMOS transistor P42 and the nMOS transistor N42 become conductive and the high-level signal $B_o$ is transferred to the output terminal S43. Since the high-level signal has been previously transferred through the pMOS transistor P41 and the nMOS transistor N41 to the output terminal S43, the output signal $C_o$ remains high-level and is kept high-level while the level of the signal $B_o$ is high.

Upon the quick fall of the signal $B_o$ to low level, the falling transient is transferred through the pMOS transistor P42 and the nMOS transistor N42 to the output terminal S43 and the output signal $C_o$ becomes low level quickly, which occurs due to the discharge of the charge stored in the capacitance of the output terminal S43. Although the signal $A_o$ becomes low level with a delay, the falling transient of the signal $A_o$ is not transferred to the output terminal S43. These operations are repeated to transfer both the rising transient and the falling transient quickly.

Figure 4A:
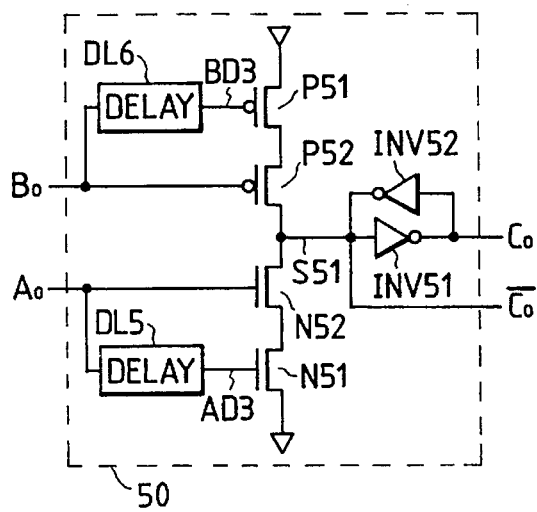
Figure 4B:
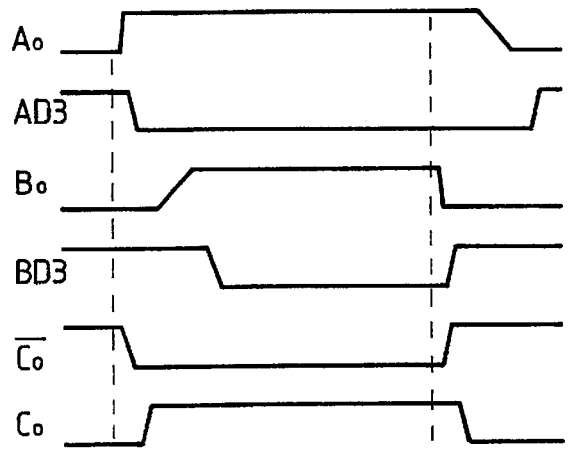
Figure 4C:
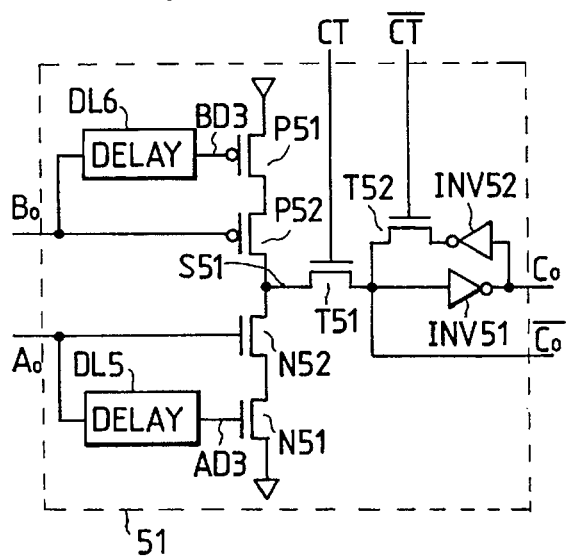
Figure 4D:
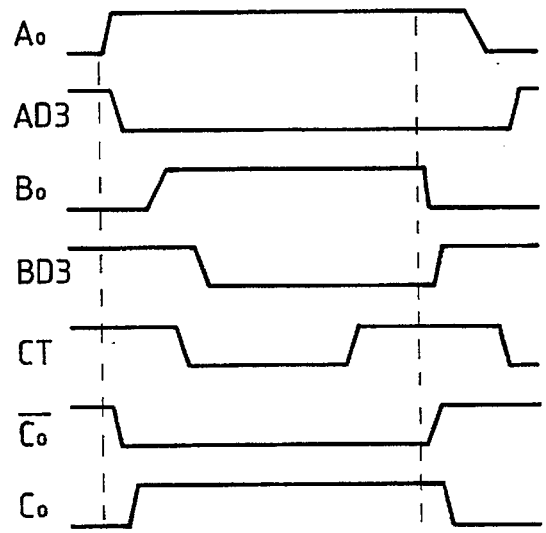
FIG. 4d is a signal waveform chart of assistance in explaining the operation of the signal merged logic circuit of FIG. 4c.

FIGS. 4a and 4c show modifications of the signal merged logic circuits 20 and FIGS. 4b and 4d are waveform charts of assistance in explaining the operations of the modifications. A signal merged logic circuit of FIG. 4a provides an output signal $C_o$ through a flip-flop, i.e., a information storage means. A signal merged logic circuit of FIG. 4c provides an output signal $C_o$ through a flip-flop connected to a control transistor. Since the respective operations of the signal merged logic circuits are basically the same, only the operation of the signal merged logic circuit of FIG. 4a will be described.

Referring to FIG. 4a, there are shown delay circuits DL5 and DL6 each including an inverter, signal selector nMOS transistors N51 and N52 and signal selector pMOS transistors P51 and P52 for controlling a signal provided at a signal merged output terminal S51, and inverters INV51 and INV52 forming a flip-flop. The nMOS transistors N52 and N51 are connected in a series connection across the terminal S51 and a grounding terminal. A signal $A_o$ is applied to the control terminal of the nMOS transistor N52, and a delayed signal AD3 obtained by the delay circuit DL5 delaying and inverting the signal $A_o$ is applied to the control terminal of the nMOS transistor N51. The inverter included in the delay circuit DL5 inverts the signal $A_o$. The pMOS transistors P52 and P51 are connected in a series connection across the terminal S51 and a grounding terminal. A signal $B_o$ is applied to the control terminal 0f the pMOS transistor P52, and a delayed signal BD3 obtained by delaying and inverting the signal $B_o$ is applied through the delay circuit DL6 to the control terminal of the pMOS transistor P51. The inverter included in the delay circuit DL6 inverts the signal $B_o$. The input terminal of the flip-flop is connected to the terminal S51, and the output terminal of the flip-flop is used as the output terminal of the signal merged logic circuit 20. An output signal $C_o$ is provided at the output terminal of the flip-flop, and an output signal $\overline{C_o}$ having the inverted phase is provided at the output terminal S51. The component inverter INV52 of the flip-flop comprises transistors having a low current drive ability capable of inverting the information held at the terminal S51 when both the nMOS transistors N51 and N52 become conductive or when both the pMOS transistors P51 and P52 become conductive.

The operation of the signal merged logic circuit 20 will be described hereinafter with reference to FIG. 4b. When the levels of the signals $A_o$ and $B_o$ are constantly high or low, either of the nMOS transistors N51 and N52, and either of the pMOS transistors P51 and P52 become nonconductive to disconnect the terminal S51 from the terminals to which the signals $A_o$ and $B_o$ are applied, and the flip-flop holds the existent information on the terminal S51.

For example, when the low-level signal $A_o$ rises quickly while a high-level signal is held at the terminal S51, (the level of the output signals $\overline{C_o}$ and $C_o$ are low), the nMOS transistor N52 becomes conductive and the nMOS transistor N51 remains conductive until the delay time determined by the delay signal AD3 elapses. Consequently, the terminal S51 is connected to the grounding terminal and the output signal $\overline{C_o}$ falls quickly. The flip-flop is inverted and the output signal $C_o$ rises quickly. Upon the elapse of the delay time, nMOS transistor N51 becomes nonconductive.

Then, the low-level signal $B_o$ rises with a delay. Then, the pMOS transistor P52 becomes nonconductive and the pMOS transistor P51 becomes conductive after the delay time has elapsed. However, since the pMOS transistor P51 has been previously become nonconductive, the rising transient of the signal $B_o$ is not transferred to the terminal S51. Consequently, the flip-flop holds the output signals $\overline{C_o}$ and $C_o$ low-level and high-level, respectively, while the level of the signals $A_o$ and $B_o$ are high.

When the high-level signal $B_o$ falls quickly in this state, the pMOS transistor P52 becomes conductive, while the pMOS transistor P51 remains conductive until the delay time determined by the delay signal BD3 elapses after the signal $B_o$ has risen. Consequently, a line connecting the terminal S51 to a power supply terminal become conductive and the output signal $\overline{C_o}$ rises quickly. The flip-flop is inverted and the output signal $C_o$ falls quickly. Upon the elapse of the delay time, the pMOS transistor P51 becomes nonconductive.

Then, the high-level signal $A_o$ falls with a delay. Then, the nMOS transistor N52 becomes nonconductive and the nMOS transistor N51 becomes conductive after the delay time has elapsed. However, the nMOS transistor N52 has been previously become conductive before the nMOS transistor N51 becomes conductive. Therefore, the falling transient of the signal $A_o$ is not transferred to the terminal S51. Thus, the flip-flop holds the output signals $\overline{C_o}$ and $C_o$ high-level and low-level, respectively. These operations are repeated to transfer both the rising and the falling transient quickly.

A signal merged logic circuit shown in FIG. 4c is provided additionally with control transistors to ensure the operation of a flip-flop. A control nMOS transistor T51 is connected across a terminal S51 and the flip-flop, and another control nMOS transistor T52 is connected across the output terminal of an inverter INV52 and the input terminal of the flip-flop. A control signal CT (FIG. 4d) that becomes high level during the high-speed transient of signals $A_o$ and $B_o$ is applied to the control terminal of the control nMOS transistor T51. Therefore, the line connecting a terminal S51 to the flip-flop becomes conducting and the high-speed transient of output signals $\overline{C_o}$ and $C_o$ occurs only when during the high-speed transient of the signals $A_o$ and $B_o$. The terminal S51 is disconnected from the flip-flop in a period for which information is held after transient. The control nMOS transistor T52 prevents the collision between an input signal to the flip-flop and an output signal from the inverter INV52. A control signal $\overline{CT}$ of a phase inverse to that of the control signal CT is applied to the control terminal of the control nMOS transistor T52 to intercept the output signal of the inverter INV52, and to hold information after transient by closing the loop of the flip-flop during a period in which information after transient is held. When it is possible to set the current drive abilities of the component transistors of the inverter INV52 to satisfactorily small values, the control nMOS transistor T52 may be omitted.

Figure 5A:
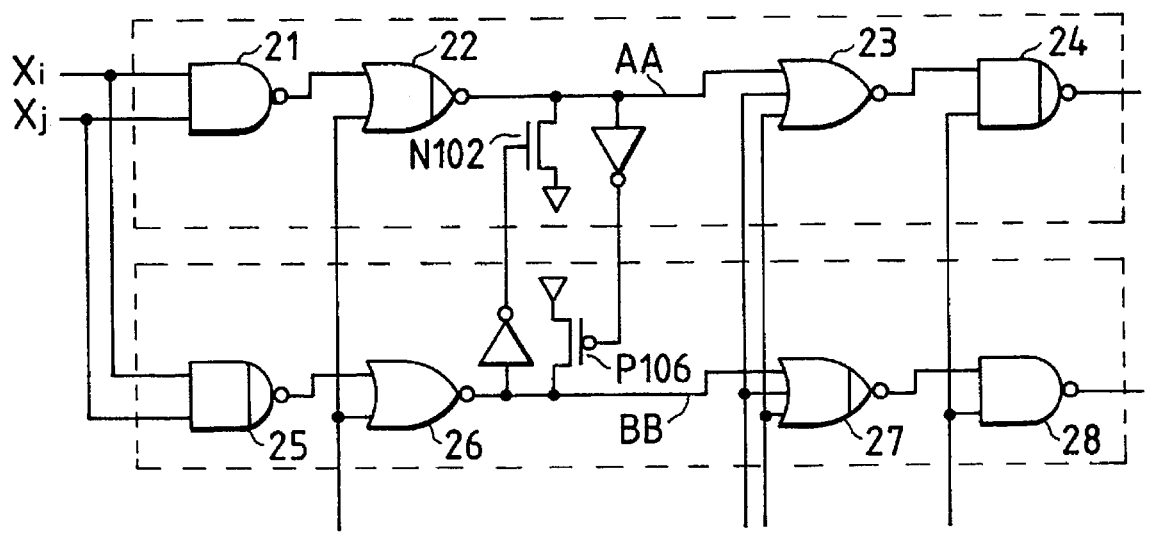
Figure 5B:
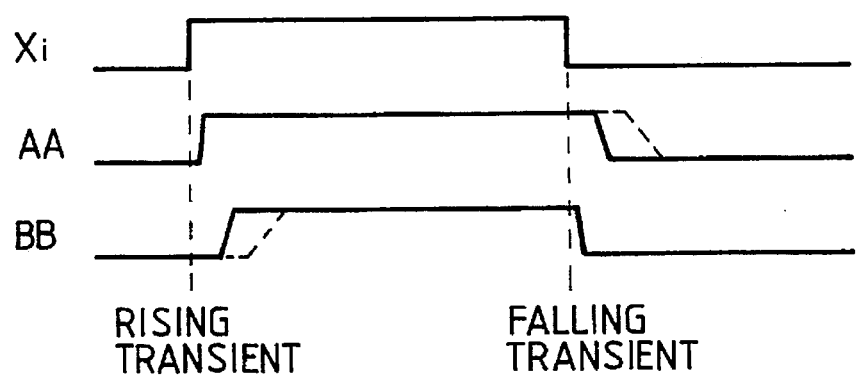

In a logic series comprising pull-down type logic gates and pull-up type logic gates connected in an alternate arrangement, the number of logic stages must be determined so that the accumulation of the delay times of low-speed signal transient must be within on processing cycle time (the time interval between the successive signal changes). To increase the number of logic stages, delay time reducing means for reducing the delay time of the low-speed signal transient at the middle of the logic series is employed. FIG. 5a shows a logic series provided with a delay time reducing means, and FIG. 5b is a waveform chart of assistance in explaining the operation of the logic series of FIG. 5a. Let's take up logic gates 22 and 26 in the logic series shown in FIG. 5a for discussion. The logic gate 22 is a pull-up type logic gate having a NOR function that provides a signal that rises quickly and falls slowly, and the logic gate 26 is a pull-down type logic gate having a NOR function that provides a signal that rises slowly and falls quickly.

A delay time reducing nMOS transistor 102 is connected across the output terminal AA of the logic gate 22 and a grounding terminal, and a delay time reducing pMOS transistor 106 is connected across the output terminal BB of the logic gate 26 and a power supply terminal to reduce the longer transient time (delay time). The terminal BB is connected through an inverter to the control terminal of the delay time reducing nMOS transistor 102, and the terminal AA is connected through an inverter to the control terminal of the delay time reducing pMOS transistor 106.

Since a signal having a high-speed falling transient is inverted and the inverted signal is given to the nMOS transistor 102, the signal at the terminal AA falls quickly as shown in FIG. 5b (a waveform indicated by a dotted line changes into a waveform indicated by a continuous line as shown in FIG. 5b). Since a signal having a high-speed rising transient is inverted and the inverted signal is given to the pMOS transistor 106, a signal at the terminal BB rises quickly as shown in FIG. 5b. Although a transient of a long delay time is transferred to the terminal BB, the transient of a long delay has no effect because the transient has been completed.

The signals applied to the respective control terminals of the nMOS transistor N102 and the pMOS transistor P106 may be signals synchronous with signal transient, such as clock signals for the same effect.

EMBODIMENT 2

Figure 6:
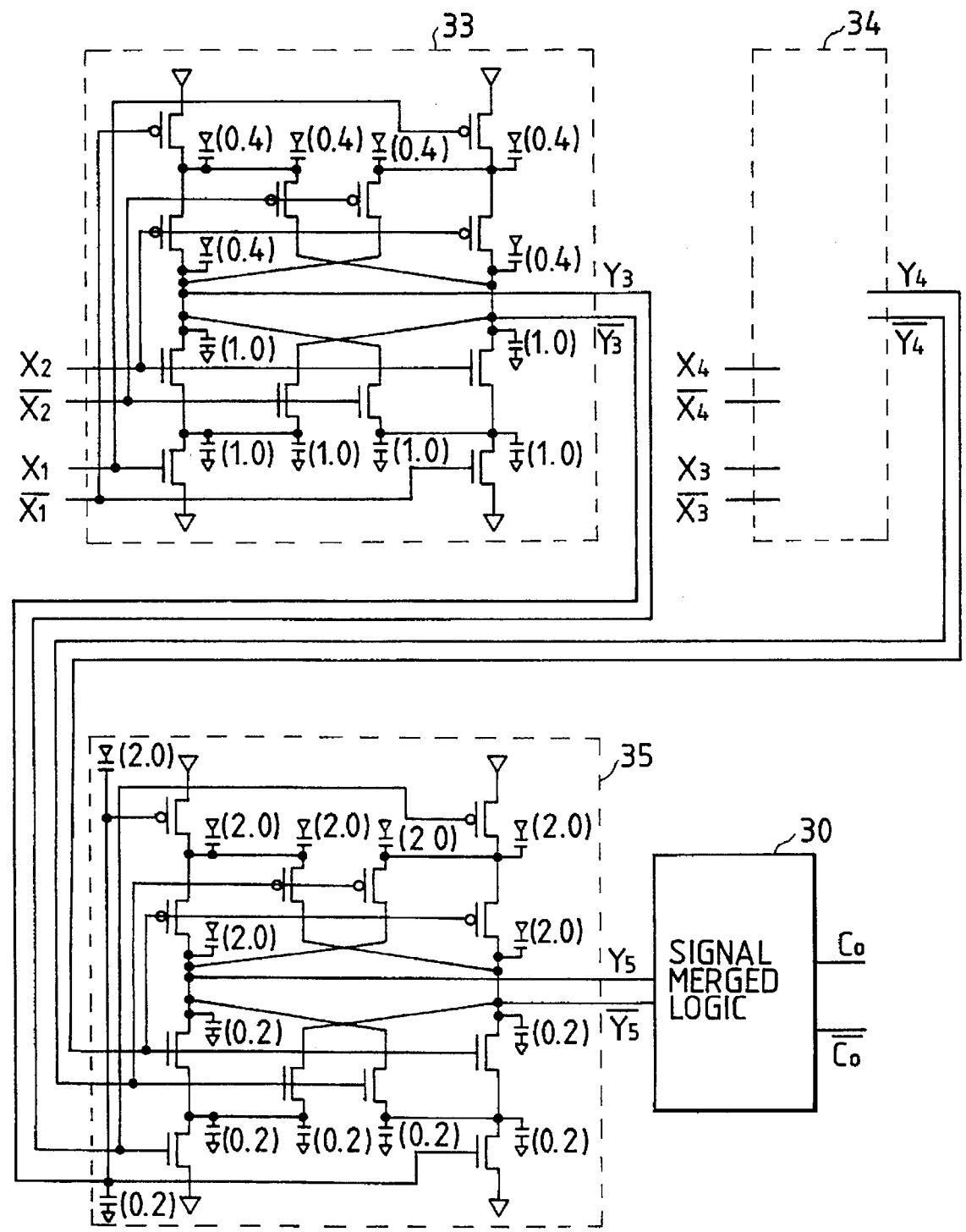
FIG. 6 is a circuit diagram of a logic circuit in a second embodiment according to the present invention.
Figure 7:
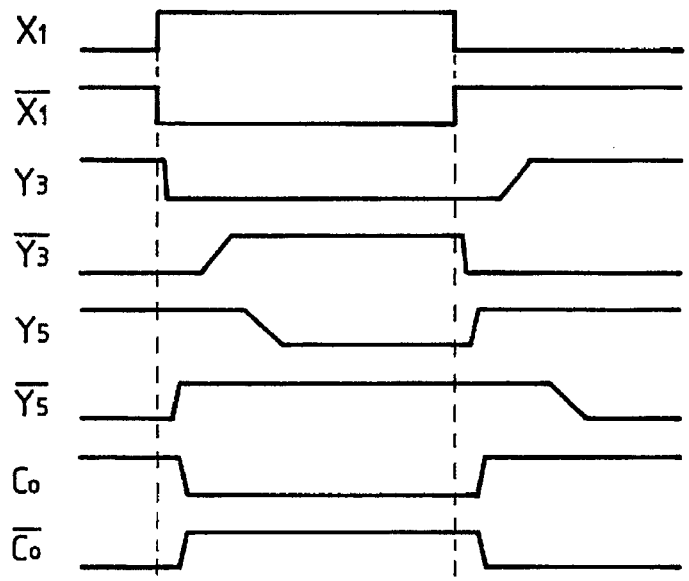
FIG. 7 is a signal waveform chart of assistance in explaining the operation of the logic circuit of FIG. 6.

The foregoing logic circuits deals with signals of a single polarity, such as the signals $X_i$ and $X_j$. A logic circuit that receives and provides a pair of signals of positive and negative polarities will be described hereinafter. FIG. 6 shows a logic circuit in a second embodiment according to the present invention and FIG. 7 is a waveform chart showing signals dealt with by the logic circuit of FIG. 7. Referring to FIG. 6, there are shown pull-down type logic gates 33 and 34, a pull-up type logic gate 35 and a signal merged logic circuit 30. The static logic gates 33 to 35 are EOR (exclusive OR) logic circuits. The respective output terminals of the logic gates 33 and 34 are connected to the input terminals of the logic gate 35. The circuit configuration of the logic gate 34 is the same as that of the logic gate 33 and hence the illustration thereof is omitted.

The logic gate 33 receives and processes input signals $X_1$, $\overline{X_1}$, $X_2$ and $\overline{X_2}$, and provides an output EOR logic signal $Y_3$ and an Output ENOR (exclusive NOR) logic signal $\overline{Y_3}$. The logic gate 34 receives and processes input signals $X_3$, $\overline{X_3}$, $X_4$ and $\overline{X_4}$ and provides an output EOR logic signal $Y_4$ and an output ENOR logic signal $\overline{Y_4}$. The logic gate 35 receives signals $Y_3$, $\overline{Y_3}$, $Y_4$ and $\overline{Y_4}$ and provides an output EOR logic signal $Y_5$ and an output ENOR logic signal $\overline{Y_5}$. This cascade connection of exclusive ORs is employed prevalently in the arithmetic unit of processors, is the most significant object of enhancement of operating speed and is one of the parts that occupies a wide area.

In the second embodiment, the current drive ability of a pMOS transistor forming a current path between the output terminal and the power supply terminal of the logic gate 33 is ⅕ that of an nMOS transistor, which also applies to the logic gate 34. In the logic gate 35, the current drive ability of an nMOS transistor forming a current path between the output terminal and a grounding terminal is ⅕ that of a pMOS transistor forming a current path between the output terminal and a power supply terminal. Therefore, as shown in FIG. 7, all the signals $Y_3$, $\overline{Y_3}$, $Y_4$ and $\overline{Y_4}$ are of a high-speed falling transient, and the signals $Y_5$ and $\overline{Y_5}$ are of a high-speed rising transient. The signal merged logic circuit 30 receives the signals $Y_5$ and $\overline{Y_5}$, and transfers only the high-speed rising transients to generate output signals $C_o$ and $\overline{C_o}$, i.e., negative of $C_o$ having a high-speed rising transient and a high-speed falling transient. The value "⅕" indicating the magnitude of the current drive ability is an example only and may be other value if necessary.

The signal merged logic circuit 30 can be constructed by using the signal merged logic circuit 20 shown in FIGS. 3a, 4a or 4c. First, the signal $Y_5$ of a high-speed rising transient is passed through an inverter that enhances a falling transient to generate a signal $\overline{Y_5}$-F of a high-speed falling transient. The output signals $C_o$ and $C_o$ can be generated by giving signals $\overline{Y_5}$ (high-speed rising transient) and $\overline{Y_5}$-F (high-speed falling transient) respectively instead of the signals $A_o$ and $B_o$ to the signal merged logic circuit 20.

Figure 8A:
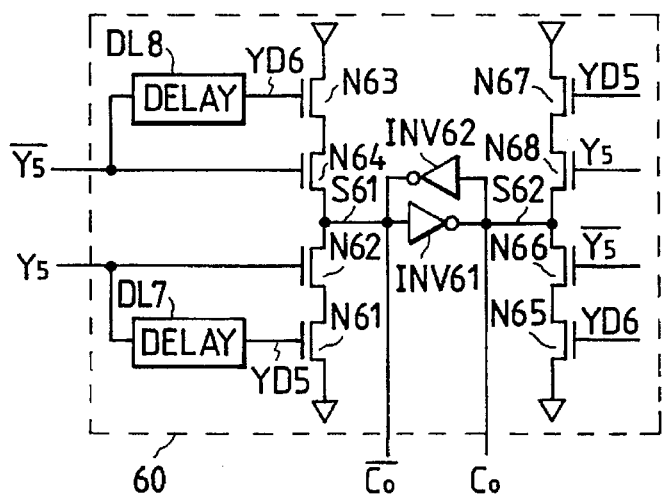
FIG. 8a is a circuit diagram of a signal merged logic circuit for merging the signals provided by the logic circuit of FIG. 6.
Figure 8B:
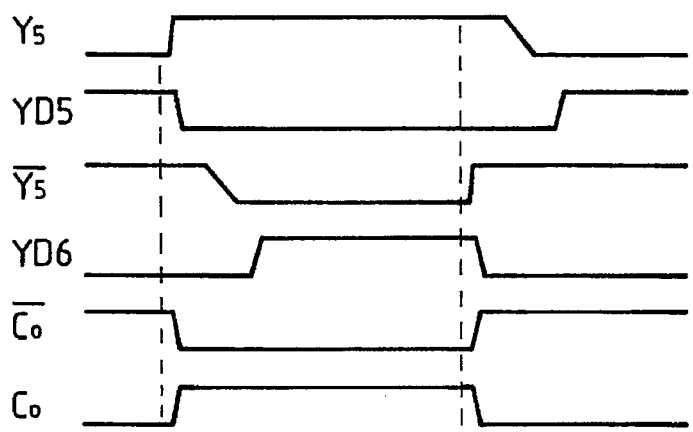
Figure 9A:
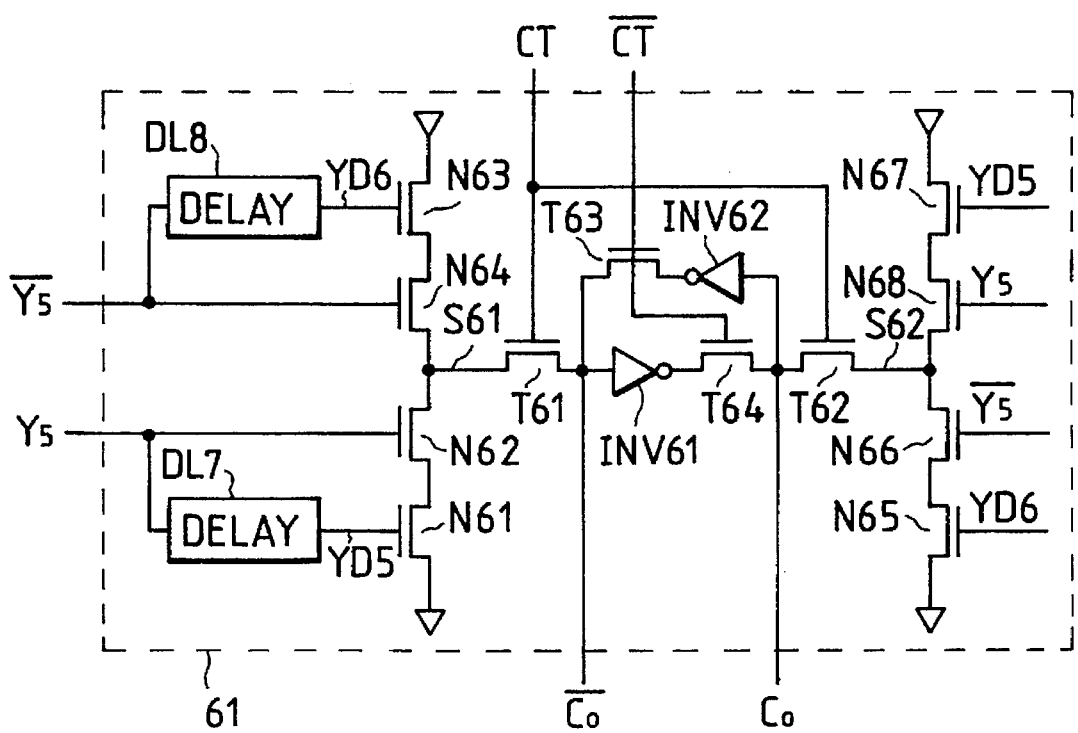
FIG. 9a is a circuit diagram of another signal merged logic circuit for merging signals provided by the logic circuit of FIG. 6.
Figure 9B:
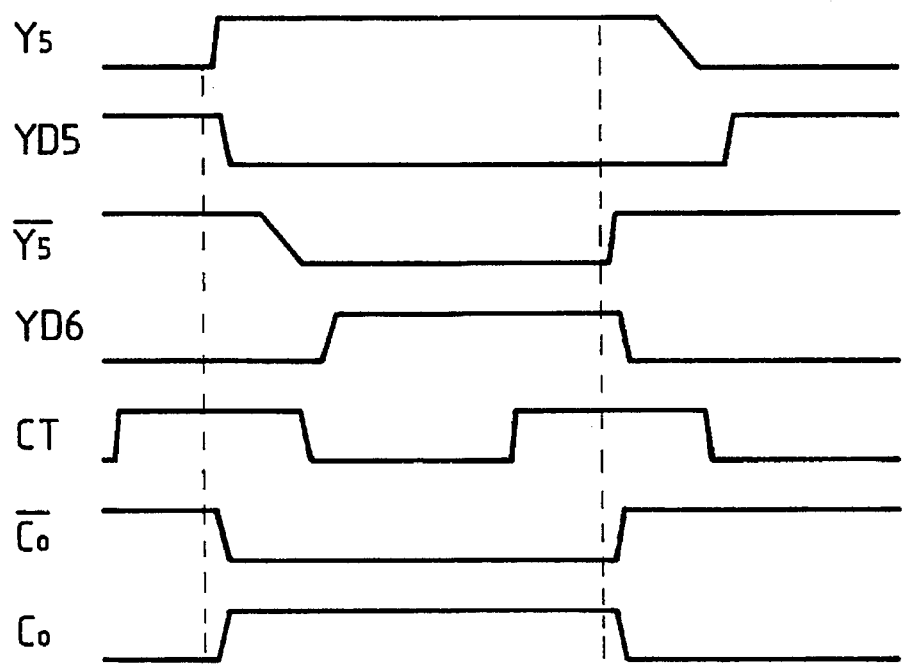

FIGS. 8a and 9a show modifications of the signal merged logic circuit 30, and FIGS. 8b and 9b are waveform charts of assistance in explaining the operations of the signal merged logic circuits of FIGS. 8a and 9a. The signal merged logic circuit shown in FIG. 8a has a flip-flop connected to a signal merged output terminal, and the signal merged logic circuit shown in FIG. 9a has a flip-flop and a control transistor connected to the flip-flop. Since the respective operations of these signal merged logic circuits are the same, only the operation of the signal merged logic circuit shown in FIG. 8a will be described in detail.

Referring to FIG. 8a, there are shown delay circuits DL7 and DL8 each including an inverter, signal selector nMOS transistors N61 to N64 for controlling a signal at a negative polarity signal merged output terminal S61, signal selector nMOS transistors N65 to N68 for controlling a signal at a positive-polarity signal merged output terminal S62, and inverters INV61 and INV62 forming flip-flops.

The nMOS transistors N61, N62, N64 and N63 are cascaded in that order across a grounding terminal and a power supply terminal, and the junction of the nMOS transistors N62 and N61 is the output terminal S61. A signal $Y_5$ and a delayed signal YD5 produced by delaying the signal $Y_5$ by the delay circuit DL7 are applied to the control terminals of the nMOS transistors N62 and N61, respectively. Since the DL7 includes an inverter, the delayed signal YD5 is inverse to the signal $Y_5$. A signal $\overline{Y_5}$ and a delayed signal YD6 produced by delaying the signal $\overline{Y_5}$ by the delay circuit DL8 are applied to the control terminals of the nMOS transistors N64 and N63, respectively. Since the delay circuit DL8 includes an inverter, the delayed signal YD is inverse to the signal $\overline{Y_5}$.

The nMOS transistors N65, N66, N68 and N67 are cascaded in that order across the grounding terminal and the power supply terminal. The junction of the nMOS transistors N66 and N68 is the output terminal S62. The signal $Y_5$ and the delayed signal YD5 are applied to the control terminals of the nMOS transistors N68 and N67, respectively, and the signal $\overline{Y_5}$ and the delayed signal YD6 are applied to the control terminals of the nMOS transistors N66 and N65, respectively. A flip-flop is connected across the output terminals S61 and S62. An output signal $C_o$ is provided at the output terminal S62 and an output signal $\overline{C_o}$ is provided at the output terminal S61. The inverter forming the flip-flop comprises transistors having a low current drive ability capable of inverting information held on the terminal S61 when both the nMOS transistors N61 and N62 or both the nMOS transistors N63 and N64 become conductive, and of inverting information held on the terminal S62 when both the nMOS transistors N65 and N66 or both the nMOS transistors N67 and N68 become conductive.

Referring to FIG. 8b, when the level of the signal $Y_5$ is low and the level of the signal $\overline{Y_5}$ is high, the nMOS transistors N62 N63, N65 and N68 become nonconductive, the existing information is held on the terminals S61 and S62.

For example, if the signal $Y_5$ becomes high level at a high rising speed when the level of the output signal $\overline{C_o}$ is high and the level of the output signal $C_o$ is low, the nMOS transistors N62 and N68 become conductive. Since the nMOS transistors N61 and N67 are held conductive for the delay time by the delay signal YD5, the capacitance of the output terminal S61 is discharged, the output signal $\overline{C_o}$ becomes low level at a high falling speed (the signal $Y_5$ is inverted), the capacitance of the output terminal S62 is charged, and the output signal $C_o$ becomes high level at a high rising speed. Upon the elapse of the delay time, the nMOS transistors N61 and N67 become nonconductive. The output signals $\overline{C_o}$ and $C_o$ are held low level and high level, respectively, by the flip-flop.

When the signal $\overline{Y_5}$ becomes low level with a delay, the nMOS transistors N64 and N66 become nonconductive. Although the nMOS transistors N63 and N65 become conductive upon the elapse of the delay time, the nMOS transistors N64 and N66 have been become nonconductive; that is, the falling transient with a long delay of the signal $\overline{Y_5}$ is not transferred.

When the signal $\overline{Y_5}$ becomes high level at a high rising speed in this state, the nMOS transistors N64 and N63 remain conductive until the delay time elapses, the capacitance of the output terminal S61 is charged, and the output signal $\overline{C_o}$ becomes high level at a high rising speed. The nMOS transistors N65 and N66 remain conductive until the delay time elapses, the capacitance of the output terminal S62 is discharged and the output signal $C_o$ becomes low level at a high falling speed (the signal $\overline{Y_5}$ is inverted). Upon the elapse of the delay time, the nMOS transistors N63 and N65 become nonconductive. The output signals $\overline{C_o}$ and $C_o$ are held high level and low level, respectively, by the flip-flop. Although the signal $Y_5$ becomes low level with a delay, the falling transient of the signal $Y_5$ is not transferred. These operations are repeated to transfer the rising transient and the falling transient of both the positive-polarity signal and the negative-polarity signal at a high speed.

FIG. 9a shows a signal merged logic circuit additionally provided with control transistors to ensure the operation of a flip-flop. Control nMOS transistors T61 and T62 are connected across a flip-flop, and terminals S61 and S62, the output terminal of an inverter INV 62 is connected through a control nMOS transistor T63 to the control nMOS transistor T61, and the output terminal of an inverter INV61 is connected through a control nMOS transistor T64 to the control nMOS transistor T62. A control signal CT that becomes high level in a period in which signals $Y_5$ and $\overline{Y_5}$ change at a high speed is applied to the control terminals of the control nMOS transistors T61 and T62. (FIG. 9b). Thus, the terminals S61 and S62 are connected to the flip-flop and output signals $C_o$ and $\overline{C_o}$ change at a high speed only when the high-speed transients of the signals $Y_5$ and $\overline{Y_5}$ are transferred. In a period where information is held after transient, the terminals S61 and S62 are disconnected from the flip-flop.

The control nMOS transistors T63 and T64 prevent the collision between an input signal to the flip-flop and output signals from the inverters INV61 and INV62. A control signal $\overline{CT}$ of a phase inverse to that of the control signal CT is applied to the control terminals of the control nMOS transistors T63 and T64. Consequently, the output signals of the inverters INV63 and INV64 are intercepted, the loop of the flip-flop is closed while information is held after transient, and the information is held. When the current drive abilities of the component transistors of the inverters INV61 and INV62 can be set at satisfactorily low values, the control nMOS transistors T63 and T64 may be omitted. A flip-flop of a conventional circuit configuration may be used instead of the flip-flop with control terminal shown in FIG. 9a.

Figure 10A:
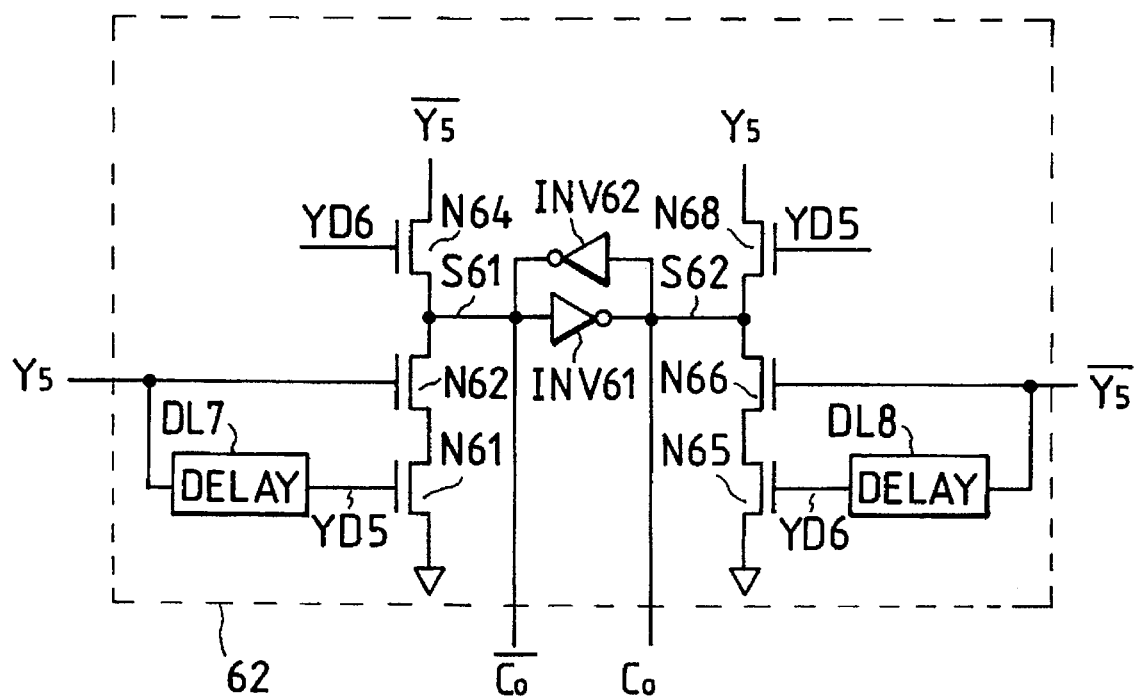
FIG. 10a is a circuit diagram of a third signal merged logic circuit for merging signals provided by the logic circuit of FIG. 6.
Figure 10B:
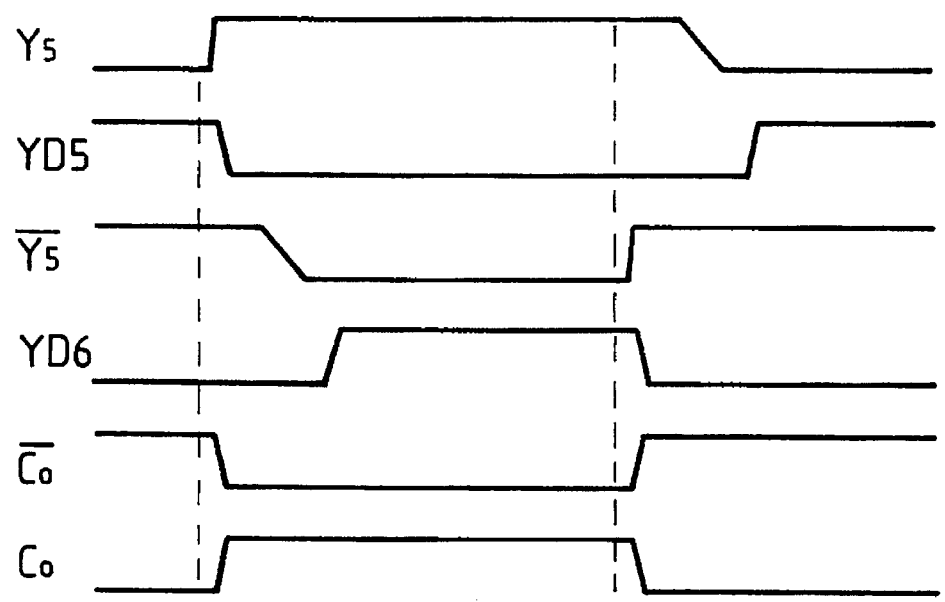

FIG. 10a shows a third modification of the signal merged logic circuit 30, and FIG. 10b is a waveform chart of assistance in explaining the operation of the signal merged logic circuit shown in FIG. 10a. The signal merged logic circuit shown in FIG. 10a is the same as that shown in FIG. 8a, except that signals $\overline{Y_5}$ and $Y_5$ are applied to the signal terminals (drain electrodes) of nMOS transistors N64 and N68, respectively, in the signal merged logic circuit shown in FIG. 10a. The operation of the circuit shown in FIG. 10a will be described with reference to FIG. 10b. When the signal $Y_5$ becomes high level at a high speed, an nMOS transistor N62 becomes conductive, and nMOS transistors N61 and N68 remain conductive until a delay time determined by a delay signal YD5 elapses. Consequently, charge stored in the capacitance of a terminal S61 is discharged, an output signal $\overline{C_o}$ becomes low level at a high speed, the capacitance of a terminal S62 is charged and an output signal $C_o$ becomes high level. Upon the elapse of the delay time, the nMOS transistor N61 and N68 become nonconductive, and a flip-flop holds the output signals $\overline{C_o}$ and $C_o$ low level and high level, respectively. When a signal $\overline{Y_5}$ becomes low level with a delay, the nMOS transistor N64 becomes conductive and the output signal $\overline{C_o}$ is held low level.

When the signal $\overline{Y_5}$ becomes high level at a high speed, the nMOS transistors N64, N65 and N66 remain conductive until the delay time elapses, the output signal $\overline{C_o}$ becomes high level at a high speed and the output signal $C_o$ becomes low level at a high speed. Upon the elapse of the delay time, the nMOS transistors N64 and N65 become nonconductive, the flip-flop holds the output signals $\overline{C_o}$ and $C_o$ high level and low level, respectively. When the signal $Y_5$ becomes low level with a delay, the nMOS transistor N68 becomes conductive and the output signal $C_o$ is held low level.

These operations are repeated to transfer the rising transient and the falling transient of both the positive-polarity signal and the negative-polarity signal at a high speed.

Figure 11A:
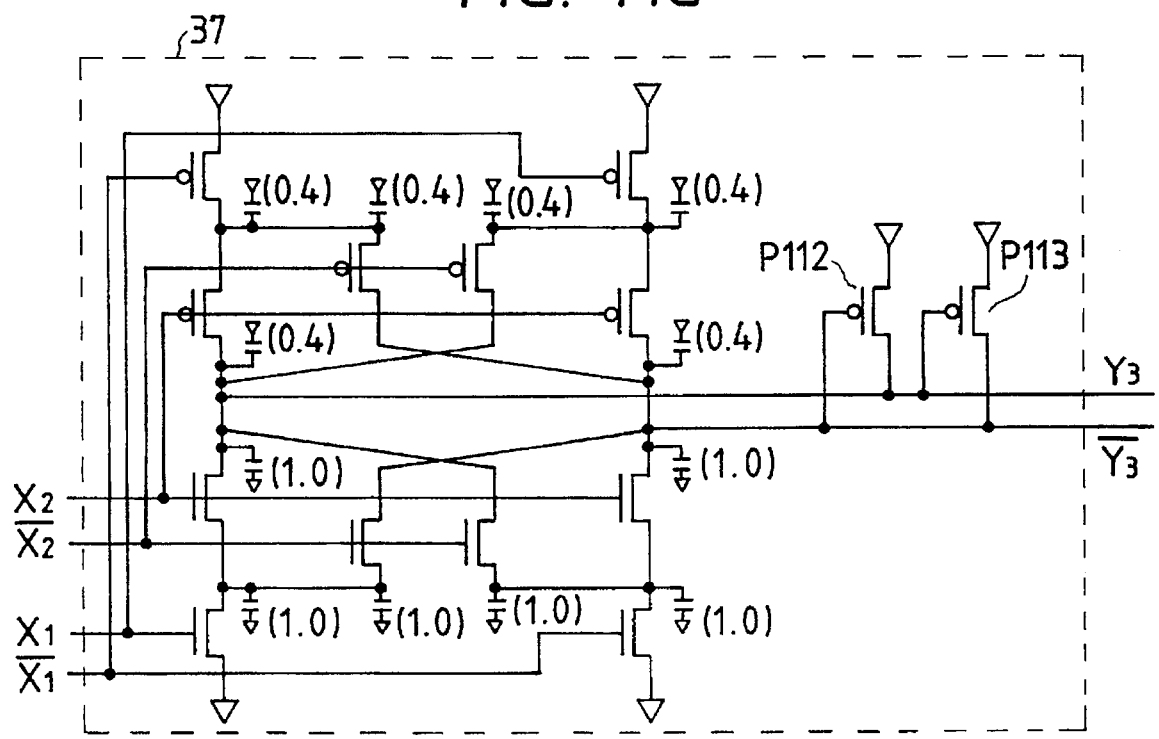
FIG. 11a is a circuit diagram of a logic circuit having a means for improving the delay time of signal transient in the logic circuit of FIG. 6.
Figure 11B:
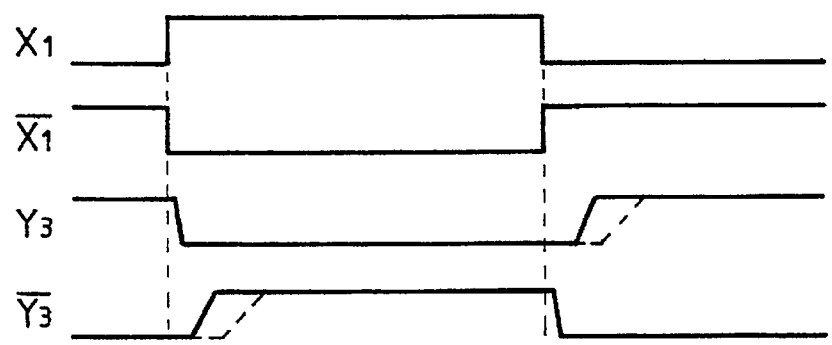

In the logic series thus constructed to deal with signals of a positive and a negative polarity, the number of logic stages can be increased by reducing the delay time of the low-speed signal transient at the middle of the logic series. FIG. 11a shows a logic circuit embodying the present invention provided with a delay time reducing means and FIG. 11b is a waveform chart of assistance in explaining the operation of the logic circuit of FIG. 11a. In FIG. 11a, indicated at 37 is as logic gate of a logic stage for discussion. The current drive abilities of pMOS transistors forming a logic network on the side of a power supply are low, output signals $Y_3$ and $\overline{Y_3}$ fall at a high speed and rise at a low speed. A delay time reducing pMOS transistor P112 is connected across a terminal for the output signal $Y_3$ and a power supply terminal, and the control terminal of the pMOS transistor P112 is connected to a terminal for the output signal $\overline{Y_3}$, to reduce the delay time of the rising transient. A delay time reducing pMOS transistor P113 is connected across the terminal for the output signal $\overline{Y_3}$, and the control terminal of the pMOS transistor P113 is connected to the terminal for the output signal $Y_3$.

Since the respective polarities of the output signals $Y_3$ and $\overline{Y_3}$ are opposite to each other, the output signal $\overline{Y_3}$ falls when the output signal $Y_3$ rises. Therefore, the output signal $Y_3$ rises at a high speed as shown in FIG. 11b when the delay time reducing pMOS transistor P112 is controlled by the signal of high-speed falling transient of the output signal $\overline{Y_3}$, so that the delay time is reduced (a waveform indicated by a dotted line changes into a waveform indicated by a continuous line). Similarly, the delay time of the rising transient of the output signal $\overline{Y_3}$ is reduced.

The signals applied to the control terminals of the delay time reducing pMOS transistors P112 and P113 may be signals synchronous with signal transient, such as clock signals, instead of the output signals $Y_3$ and $\overline{Y_3}$ for the same effect.

When a logic gate of a high-speed rising transient is used, the delay time can be reduced by employing transistors of a conduction type opposite that of the delay time reducing pMOS transistors P112 and P113, such as nMOS transistors, and connecting the transistors across the terminals for the output signals $Y_3$ and $\overline{Y_3}$ and the grounding terminals, respectively.

Figure 12A:
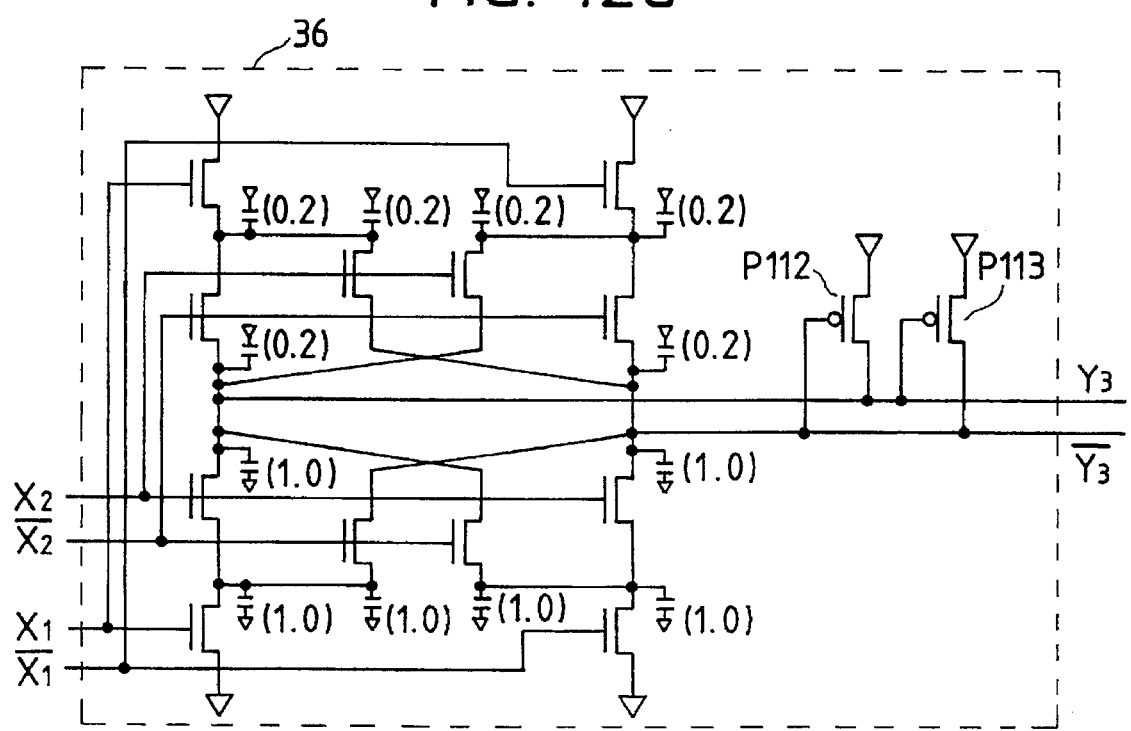
FIG. 12a is a circuit diagram of a logic circuit in a third embodiment according to the present invention.
Figure 12B:
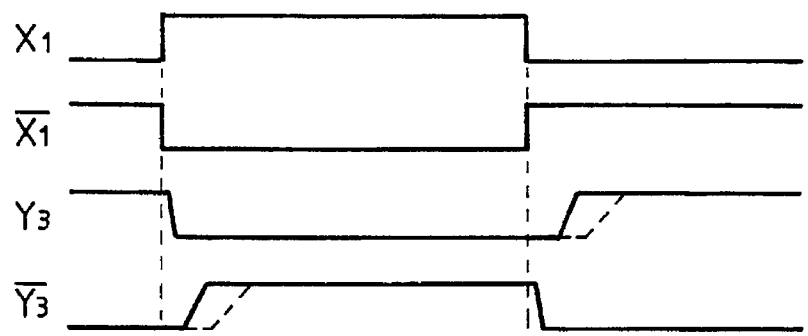

Although the foregoing logic circuits employ the pMOS transistor and the nMOS transistor in a complementary relation, a logic circuit embodying the present invention shown in FIG. 12a is constructed by replacing all the pMOS transistors with nMOS transistors of the same logical function. FIG. 12b is a waveform chart of assistance in explaining the operation of the logic circuit shown in FIG. 12a. The logical function of a logic gate 36 is the same as that of the logical gate 33 of FIG. 6. The connection of a positive-polarity signal and a negative-polarity input signal to the current paths between the power supply terminal and the output terminals in the logic gate 36 is inverse to that in the logic gate 33 of FIG. 6. Since the circuit in this embodiment is constructed entirely of nMOS transistors, the capacitance of the circuit and the input capacitance of the logic gate are smaller than those of the logic gate of FIG. 6.

However, a logic circuit constructed entirely of nMOS transistors needs a means for deciding high level of the output terminals. A means for such a purpose is, for example a cross connection of pMOS transistors, an additional flip-flop or connection of a feedback circuit through an inverter and a pMOS transistor. This embodiment employs a cross connection of pMOS transistors. In FIG. 12a, pMOS transistors P112 and P113 are in a cross connection. These additional transistors may be those having low current drive abilities and a small size, and do not affect the operation and function of the logic circuit. The cross-connected transistors P112 and P113 reduced the delay time of a low-speed rising transient as shown in FIG. 12b.

Figure 13A:
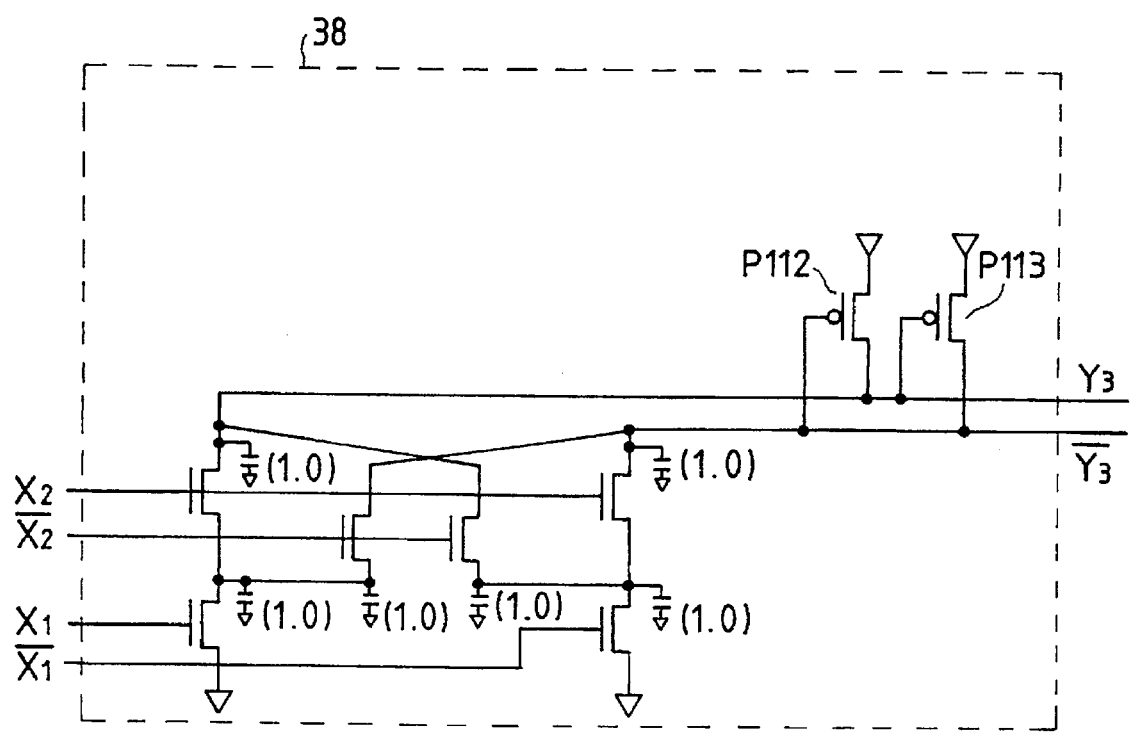
Figure 13B:
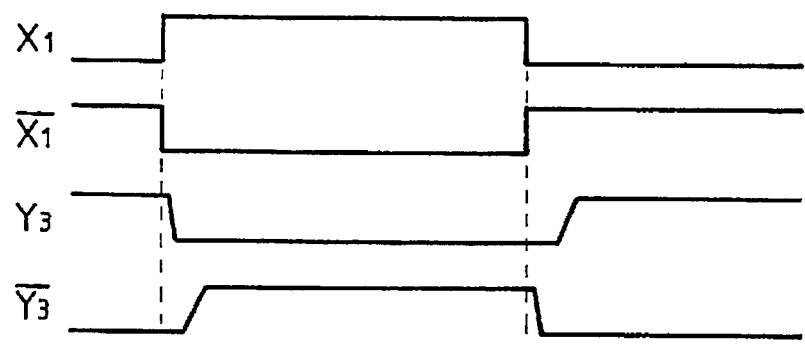

In the logic gates provided with the delay time reducing transistors shown in FIGS. 11a and 12a, the pMOS transistor forming the power supply current path among the pair of transistors that receives input signals (nMOS transistor in FIG. 12a) may be omitted. FIG. 13a shows a circuit of such a configuration, and FIG. 13b is a waveform chart of assistance in explaining the operation of the circuit shown in FIG. 13a.

Referring to FIG. 13a, only nMOS transistors receive input signals $X_1$, $\overline{X_1}$, $X_2$ and $\overline{X_2}$. Similarly to those of the embodiment shown in FIG. 12a, pMOS transistors P112 and P113 are connected to terminals for output signals $Y_3$ and $\overline{Y_3}$, respectively. The current drive abilities of the pMOS transistors P112 and P113 are lower than those of the nMOS transistors that receive input signals $X_1$, $\overline{X_1}$, $X_2$ and $\overline{X_2}$. When the line interconnecting the terminal for the output signal $Y_3$ and a grounding current path becomes conductive upon the reception of the input signal, the output signal $Y_3$ rises to control the pMOS transistor P113 and the output signal $\overline{Y_3}$ rises as shown in FIG. 13b. (When the output signal $\overline{Y_3}$ falls, the pMOS transistor P112 is controlled and the output signal $Y_3$ rises.)

The pull-down type logic gate has the above-mentioned configuration. In the pull-up type logic gate, the transistor forming the grounding current path among the pair of transistors that receive input signals may be omitted and only the transistor forming the power supply current path may be used.

In this embodiment, either the pMOS transistor forming the power supply current path or the nMOS transistor forming the grounding current path may be omitted. Consequently, the circuit area and the power consumption can be greatly reduced.

TRIAL LOGIC CIRCUITS OF THE INVENTION, TEST RESULTS AND COMPARISON OF TRIAL AND CONVENTIONAL LOGIC CIRCUITS

Trial logic circuits in accordance with the present invention corresponding to the embodiments shown in FIGS. 1 and 6 were fabricated, the operating speed, the power consumption and the circuit area of the trial logic circuits were measured, and the measured results were compared with those of conventional CMOS logic circuits. For comparison on the same basis, the higher and the lower current drive abilities of embodiment 1 and embodiment 2 are the same. The logical function of the comparative embodiments is the same as those of embodiment 1 and embodiment 2, and the current drive ability of the same is equal to the higher current drive ability of embodiment 1 and embodiment 2.

LOGIC CIRCUIT OF EMBODIMENT 1

The values of conductive resistances of the nMOS transistors N11 and N12 of the front logic gate 1 were respectively R, the values of the junction capacitances NCD11 and NCD12 were respectively $C_D$, the values of the conductive resistances of the pMOS transistors P11 and P12 were respectively 5R, and the values of the junction capacitances PCD11 and PCD12 were respectively 0.4 $C_D$. The values of the conductive resistances of the pMOS transistors P13 and P14 of the back logic gate 2 were respectively R, the value of the gate capacitance PCG13 was $2C_G$, and the values of the junction capacitances PCD13 and PCD14 were respectively $2C_D$. The values of conductive resistances of the nMOS transistors N13 and N14 were respectively 5R, the value of the gate capacitance NCG13 was $0.2C_G$, and the values of the junction capacitances NCD13 and NCD14 were respectively 0.2 $C_D$.

The time constant $t_{f1}$ of the falling transient of the front logic gate 1 and the time constant $t_{r2}$ of the rising transient of the back logic gate 2 can be expressed by simplified expressions (1) and (2), and the delay time $t_{d1}$ of the high-speed transient of the static logic circuit of the present invention is the mean of the times expressed by expressions (1) and (2), which is expressed by expression (3). In the expressions, F is number of fan-out.

$$t_{f1} = RC_D + 2R(C_D + 0.4C_D + 0.4C_D + 2.2FC_G) \qquad (1)$$
$$= 4.6RC_D + 4.4FRC_G$$

$$t_{r2} = 2RC_D + 2R(0.2C_D + 0.2C_D + 2C_D + 1.4FC_G) \qquad (2)$$
$$= 6.8RC_D + 2.8FRC_G$$

$$t_{d1} = (t_{f1} + t_{r2})/2 = 5.7RC_D + 3.6FRC_G \qquad (3)$$

The delay time of the conventional CMOS logic circuit is:

$$9RC_D + 4.5FRC_G$$

As is obvious from the expressions, the operating speed of embodiment 1 was far higher than that of the conventional CMOS logic circuit. The present invention reduced the rate of reduction of the operating speed with the increase of the fan-out.

In the static logic circuit in embodiment 1, the logic series A and B shown in FIG. 2 were used in combination to produce a signal that rises and falls at a high speed. Therefore, the power consumption of each logic gate of the static logic circuit in embodiment 1 is the sum of the respective power consumption of the logic gates 21 and 25 of FIG. 2a. The power consumption is proportional to the total capacitance of the circuit of both the logic circuit:

$$7.2C_D + 3.6FC_G,$$

and the product of the operating frequency and the rate of signal transient. Since the total capacitance of the conventional CMOS logic circuit is:

$$6C_D + 3FC_G$$

the power consumption of embodiment 1 is approximately equal to that of the conventional CMOS logic circuit.

Suppose that the circuit area of a static logic circuit is represented by the sum of the widths of the gates of the transistors. Then, the circuit area of the static logic circuit of FIG. 2a is 7.2 W when the gate widths of the nMOS transistors N11 and N12 of FIG. 1a are W. The circuit area of 7.2 W is somewhat greater than the circuit area of 6 W of the conventional CMOS logic circuit.

LOGIC CIRCUIT OF EMBODIMENT 2

The signal delay time $t_{f3}$ of a static logic circuit in embodiment 2 is calculated by the method employed in calculating the signal delay time of the static logic circuit of FIG. 1a and is expressed by:

$$t_\beta = 2RC_D + 2R(C_D + 0.4C_D + 2.2FC_G) \quad (4)$$
$$= 4.8RC_D + 4.4FRC_G$$

Since the signal delay time of a conventional CMOS logic circuit is:

$$9RC_D + 6FRC_G$$

it was proved that the operating speed of the logic circuit in embodiment 2 is far higher than that of the conventional CMOS logic circuit.

The power consumption is proportional to the total capacitance of the circuit:

$$8.4C_D + 2.2FC_G,$$

the operating frequency and the rate of signal transients. Since the total capacitance of the conventional CMOS logic circuit is:

$$18C_D + 3FC_G,$$

it was found that the power consumption of the static logic circuit in embodiment 2 is far less than that of the conventional CMOS logic circuit. The circuit area of the static logic circuit is 8.4 W when the gate widths of the nMOS transistors N11 and N12 are W. The circuit area of 8.4 W is far less than the circuit area of 18 W of the conventional CMOS static logic circuit.

The operating speed of the novel logic circuit of the present invention provided with the transistors forming current paths and having lower current drive abilities is far higher than that of the conventional CMOS logic circuit. The employment of the logic circuit that receives and provides a positive-polarity signal and a negative-polarity signal enhances the speed and reduces the power consumption and circuit area greatly. Capable of being fabricated by the conventional semiconductor device fabricating techniques, the logic circuit of the present invention is very advantageous in respect of practical application.

It is further understood by those skilled in the art that the foregoing description is a preferred embodiment of the disclosed device and that various changes and modifications may be made in the invention without departing from the spirit and scope thereof.

What is claimed is:

1. A static logic circuit comprising:

a logic series containing a plurality of logic gates including at least one first-type logic gate and at least one second-type logic gate, said first-type logic gate and said second-type logic gate each including a first current path, a second current path, a supply terminal, a ground terminal, at least one input terminal, and an output terminal, said first current path containing a plurality of transistors connected between the supply terminal and the output terminal, and said second current path containing a plurality of other transistors connected between the ground terminal and the output terminal, wherein one of said plurality of transistors and one of said plurality of other transistors form a pair, with said one of said plurality of transistors having a control electrode connected to a control electrode of said one of said plurality of other transistors to form said at least one input terminal, wherein, when an input signal supplied to said at least one input terminal is at a first predetermined level, said second current path becomes non-conductive and said first current path becomes conductive, and when an input signal supplied to said at least one input terminal is at a second predetermined level, said first current path becomes non-conductive and said second current path becomes conductive, wherein said plurality of transistors in the first current path of said first-type logic gate have lower current drive abilities than current drive abilities of said plurality of other transistors in the second current path of said first-type logic gate, and wherein said plurality of other transistors in the second current path of said second-type logic gate have lower current drive abilities than current drive abilities of said plurality of transistors in the first current path of said second-type logic gate.

2. A static logic circuit according to claim 1, further comprising:

a first signal merged logic circuit and a second circuit merged logic circuit, a third-type logic gate formed from two of said first-type logic gates and having at least one pair of input terminals for supplying, respectively, a first positive polarity input signal and a first negative polarity input signal, and a pair of output terminals for supplying a first positive polarity output signal and a first negative polarity output signal, a fourth-type logic gate formed from two of said second-type logic gates and having at least one pair of input terminals for supplying a second positive polarity input signal and a second negative polarity input signal, and a pair of output terminals for supplying a second positive polarity output signal and a second negative polarity output signal, wherein said logic series contains a cascade connection of N stages of alternating third-type and fourth-type logic gates, wherein said first signal merged logic circuit includes a first input terminal, a second input terminal, a first output terminal, and a second output terminal, wherein said fourth-type logic gate is arranged at an Nth stage of said N stages, wherein said first signal merged logic circuit is connected to said fourth-type logic gate, with said first input terminal being supplied with said second positive-polarity output signal and said second input terminal being supplied with said second negative-polarity output signal, wherein said first signal merged logic circuit further includes first means for transmitting low-to-high transition of said second positive and said second negative polarity output signals to said first and said second output terminals, respectively, and high-to-low transitions of inverted signals of said second positive and said second negative polarity output to said second and said first output terminal, respectively, and for interrupting transmission of high-to-low transitions of said second positive and said negative polarity output signals to said first and said second output terminals, respectively, and for interrupting transmission of lowto-high transitions of the inverted signals of said second positive and said second negative polarity outputs to said second and said first output terminals, respectively, wherein said second signal merged logic circuit includes a third input terminal, a fourth input terminal, a third output terminal, and a fourth output terminal, wherein said third-type logic gate is arranged at an Nth stage of the N stages, wherein said second signal merged logic circuit is connected to said third-type logic gate, with said third input terminal being supplied with said first positive polarity output signal and said fourth input terminal being supplied with said first negative polarity output signal, wherein said second signal merged logic circuit includes second means for transmitting high-to-low transitions of said first positive and said negative polarity output signals to said third and said fourth output terminals, respectively, and low-to-high transitions of inverted signals of said first positive and said negative polarity outputs to said fourth and said third output terminals, respectively, and for interrupting transmission of low-to-high transitions of said first positive and said first negative polarity output signals to said third and said fourth output terminals, respectively, and for interrupting transmission of high-to-low transitions of the inverted signals of said first positive and said negative polarity outputs to said fourth and said third output terminals, respectively.

3. A static logic circuit according to claim 2, wherein said first means has a first, a second, a third, a fourth, a fifth and a sixth transistor for signal selecting, a first and a second delay circuit having an output signal whose polarity is inverted from that of an input signal, first level holding means composed of a flip-flop circuit, said first transistor having a control, a drain and a source electrode being connected to said first input terminal, and said second output terminal and a drain electrode of said second transistor respectively, said second transistor having a control and a source electrode being connected to said first input terminal through said first delay circuit and the ground terminal respectively, said third transistor having a control, a drain and a source electrode being connected to said second input terminal, said first output terminal and a drain electrode of said fourth transistor respectively, said fourth transistor having a control and a source electrode being connected to said second input terminal through said second delay circuit and the ground terminal respectively, said fifth transistor having a control, a drain and a source electrode being connected to said first input terminal through said first delay circuit, said first output terminal and said first output terminal respectively, said sixth transistor having a control, a drain and a source electrode being connected to said second input terminal through said second delay circuit, said second input terminal and said second output terminal respectively, said first level holding means being connected between said first and said second output terminal;

and wherein said second means has a seventh, an eighth, a ninth, a tenth, a seventh, an eighth, a ninth, a tenth, an eleventh and a twelfth transistor for signal selecting, a third and an fourth delay circuit having an output signal whose polarity is inverted from that of an input signal, second level holding means composed of a flip-flop circuit, said seventh transistor having a control, a drain and a source electrode being connected to said third input terminal, said fourth output terminal and a drain electrode of said eighth transistor respectively, said eighth transistor having a control and a source electrode being connected to said third input terminal through said third delay circuit and the supply terminal respectively, said ninth transistor having a control, a drain and a source electrode being connected to said fourth input terminal, said third output terminal and a drain electrode of said tenth transistor respectively, said tenth transistor having a control and a source electrode being connected to said fourth input terminal through said fourth delay circuit and the supply terminal respectively, said eleventh transistor having a control, a drain and a source electrode being connected to said third input terminal through said third delay circuit, said third input terminal and said third output terminal respectively, said twelfth transistor having a control, a drain and a source electrode terminal being connected to said fourth input terminal through said fourth delay circuit, said fourth input terminal and said fourth output terminal respectively, said second level holding means being connected between said third and said fourth output terminal.

4. A static logic circuit according to claim 3, wherein:

each of said first and said second level holding means has two switching transistors in a feedback loop of the flip-flop circuit, said first signal merged logic circuit has a switching transistor being connected between said second output terminal and a connection node of said first and said sixth transistor, and a switching transistor being connected between said first output terminal and a connection node of said third and said fifth transistor, said second signal merged logic circuit has a switching transistor being connected between said fourth output terminal and a connection node of said seventh and said twelfth transistor, and a switching transistor being connected between said third output terminal and a connection node of said ninth and said eleventh transistor.

5. A static logic circuit according to claim 2, wherein said first means includes a first, a second, a third, a fourth, a fifth, a sixth, a seventh, and an eighth transistor for signal selecting, a first and a second delay circuit having an output signal whose polarity is inverted from that of an input signal, and first level holding means including a flip-flop circuit, wherein said first transistor includes a control, a drain, and a source electrode connected to said first input terminal, said second output terminal, and a drain electrode of said second transistor, respectively, wherein said second transistor includes a control electrode and a source electrode connected to said first input terminal through said first delay circuit and the ground terminal, respectively, wherein said third transistor includes a control, a drain, and a source electrode connected to said second input terminal, a source electrode of said fourth transistor, and said second output terminal, respectively, wherein said fourth transistor includes a control and a drain electrode connected to said second input terminal through said second delay circuit and the supply terminal, respectively, wherein said fifth transistor includes a control, a drain, and a source electrode connected to said first input terminal, a source electrode of said sixth transistor, and said first output terminal, respectively, wherein said sixth transistor includes a control and a drain electrode connected to said first input terminal through said first delay circuit and the supply terminal, respectively, wherein said seventh transistor includes a control, a drain, and a source electrode connected to said second input terminal, said first output terminal, and a drain electrode of said eighth transistor, respectively, wherein said eighth transistor includes a control and a source electrode connected to said second input terminal through said second delay circuit and the grounds terminal, respectively, wherein said first level holding means is connected between said first and said second output terminal, and wherein said second means has a ninth, a tenth, an eleventh, a twelfth, a thirteenth, a fourteenth, a fifteenth, and a sixteenth transistor for signal selecting, a third and a fourth delay circuit having an output signal whose polarity is inverted from that of an input signal, and a second level holding means composed of a flip-flop circuit, said ninth transistor having a control, a drain and a source electrode connected to said third input terminal, said fourth output terminal and a drain electrode of said tenth transistor respectively, said tenth transistor having a control and a source electrode connected to said third input terminal through said third delay circuit and the supply terminal respectively, said eleventh transistor having a control, a drain and a source electrode connected to said fourth input terminal, a source electrode of said twelfth transistor and said fourth output terminal respectively, said twelfth transistor having a control and a drain electrode connected to said fourth input terminal through said fourth delay circuit and the ground terminal respectively, said thirteenth transistor having a control, a drain and a source electrode connected to said third input terminal, a source electrode of said fourteenth transistor and said third output terminal respectively, said fourteenth transistor having a control and a drain electrode connected to said third input terminal through said third delay circuit and the ground terminal respectively, said fifteenth transistor having a control, a drain and a source electrode connected to said fourth input terminal and said third output terminal and a drain electrode of sixteenth transistor respectively, said sixteenth transistor having a control and a source electrode connected to said fourth input terminal through said fourth delay circuit and the supply terminal, respectively, said second level holding means connected between said third and said fourth output terminal.

6. A static logic circuit according to claim 5, wherein each of said first and said second level holding means has two switching transistors in a feedback loop of the flip-flop circuit, said first signal merged logic circuit has a switching transistor connected between said second output terminal and a connection node of said first and said third transistor, and a switching transistor connected between said first output terminal and a connection node of said fifth and said seventh transistor, said second signal merged logic circuit has a switching transistor connected between said fourth output terminal and a connection node of said ninth and said eleventh transistor, and a switching transistor connected between said third output terminal and a connection node of said thirteenth and said fifteenth transistor.

7. A static logic circuit according to claim 2, further comprising a first and a second transistor, where said third type of logic gate is put at a K-th ($1 \leq K \leq N$) stage of the N stages, said first transistor connected between the output terminal for said first positive-polarity output signal of said third type of logic gate at the K-th stage and the supply terminal, having a control electrode connected to the output terminal for said first negative-polarity output signal of said third type of logic gate at the K-th stage, said second transistor connected between the output terminal for said first negative-polarity output signal of said third type of logic gate at the K-th stage and the supply terminal, having a control electrode connected to the output terminal for said first positive-polarity output signal of said third type of logic gate at the K-th stage;

and further comprising a third and a fourth transistor, where said fourth type of logic gate is put at the K-th stage of the N stages, said third transistor connected between the output terminal for said second positive-polarity output signal of said fourth type of logic gate at the K-th stage and the ground terminal, having a control electrode connected the output terminal of said second negative-polarity output signal of said fourth type of logic gate at the K-th stage, said fourth transistor connected between the output terminal for said second negative-polarity output signal of said fourth type of logic gate at the K-th stage and the ground terminal, having a control electrode connected the output terminal of said fourth type of logic-gate at the K-th stage.

8. A static logic circuit according to claim 2, further comprising a first and a second transistor, a first and a second control signal supplied to a control electrode of said first transistor and control electrode of said second transistor respectively, where said third type of logic gate is put at the K-th stage of the N stages, said first transistor connected between the supply terminal and the output terminal for said first positive-polarity output signal of said third type of logic gate at the K-th stage, said second transistor connected between the supply terminal and the output terminal for said first negative-polarity output signal of said third type of logic gate at the K-th stage, said first control signal being synchronized with the high-to-low transition of said first negative-polarity output signal, said second control signal being synchronized with the high-to-low transition of said first positive-polarity output signal;

and further comprising a third and a fourth transistor, a third and a fourth control signal supplied to a control electrode of said third transistor and a control electrode of said fourth transistor respectively, where said fourth type of logic gate is put at the K-th stage of the N stages, said third transistor connected between the ground terminal and the output terminal for said second positive-polarity output signal of said fourth type of logic gate at the K-th stage, said fourth transistor connected between the ground terminal and the output terminal for said second negative-polarity output signal of said fourth type of logic gate at the K-th stage, said third control signal being synchronized with the low-to-high transition of said second negative-polarity output signal, said fourth control signal being synchronized with the low-to-high transition of said second positive-polarity output signal.

9. A static logic circuit according to claim 1, wherein said plurality of logic gates includes a plurality of first-type logic gates and a plurality of second-type logic gates connected in an alternating cascade configuration.

10. A static logic circuit according to claim 1, wherein said first-type logic gate and said second-type logic gate are connected in an alternating cascade configuration.

11. A static logic circuit according to claim 10, further comprising:

a signal merged logic circuit having a first input terminal, a second input terminal, and a first output terminal, wherein said logic series contains a first-type logic series and a second-type logic series, said first-type logic series having N stages of said first-type logic gates and said second-type logic gates, with a first-type logic gate being arranged as a first stage in said N stages, and said second-type logic series having N stages of said first-type logic gates and said second-type logic gates, with a second-type logic gate being arranged as a first stage in said N stages, wherein said first-type logic series and said second-type logic series perform a same logical function, wherein said one input signal is supplied to the input terminal of said first-type logic gate located in the first stage of said first-type logic series and the input terminal of said second-type logic gate located in the first stage of said second-type logic series, wherein said first input terminal of said signal merged logic circuit is connected to an output terminal of one of said second-type logic gates located in an Nth stage of said N stages in said first-type logic series, wherein said second input terminal of said signal merged logic circuit is connected to an output terminal of one of said first-type logic gates located in an Nth stage of the N stages in said second-type logic series, and wherein said signal merged logic circuit further includes means for transmitting a low-to-high transition of an output signal output from the output terminal of said one of said second-type logic gates to said first output terminal and for transmitting a high-to-low transition of an output signal output from the output terminal of said one of said first-type logic gates to said first output terminal, and for interrupting a transmission of a high-to-low transition of the output signal output from the output terminal of said one of said second-type logic gates to said first output terminal and for interrupting a transmission of a low-to-high transition of the output signal output from the output terminal of said one of said first-type logic gate to said first output terminal.

12. A static logic circuit according to claim 11, wherein said means has a first, a second, a third and a fourth transistor for signal selecting, a first and a second delay circuit providing an output signal whose polarity is inverted from that of an input signal, level holding means composed of a flip-flop circuit, a second output terminal for a negative polarity output signal, said first transistor having a control, a drain and a source electrode being connected to said first input terminal, said second output terminal and a drain electrode of said second transistor respectively, said second transistor having a control and a source electrode being connected to said first input terminal through said first delay circuit and the ground terminal respectively, said third transistor having a control, a drain and a source electrode being connected to said second input terminal, said second output terminal and a drain electrode of said fourth transistor respectively, said fourth transistor having a control and a source electrode being connected to said second input terminal through said second delay circuit and the supply terminal respectively, said level holding means being connected between said first and said second output terminal.

13. A static logic circuit according to claim 12, wherein said level holding means has a switching transistor in a feedback loop of the flip-flop circuit, said signal merged logic circuit has a switching transistor being connected between said first output terminal and a connection node of said first and said third transistor.

14. A static logic circuit according to claim 11, wherein said means includes a first signal selecting transistor, a second signal selecting transistor, a first and a second delay circuit providing an output signal whose polarity is inverted from that of an input signal, wherein said first transistor includes a control, a drain, and a source electrode connected to said first input terminal through said first delay circuit, said first input terminal, and said first output terminal, respectively, wherein said second transistor includes a control, a drain, and a source electrode connected to said second input terminal through said second delay circuit, said second input terminal, and said first output terminal, respectively.

15. A static logic circuit according to claim 11, further comprising a first and a second transistor, a first and a second inverter, said first transistor connected between the supply terminal and the output terminal of said first type of logic gate at a K-th ($1 \leq K \leq N$) stage of the N stages, said second transistor connected between the ground terminal and the output terminal of said second type of logic gate at the K-th stage of the N stages, said first inverter connected between a control electrode of said first transistor and the output terminal of said second type of logic gate at the K-th stage, said second inverter connected between a control electrode of said second transistor and the output terminal of said first type of logic gate at the K-th stage.

16. A static logic circuit according to claim 11, further comprising:

a first and a second transistor, a first and a second control signal supplied to a control electrode of said first transistor and a control electrode of said second transistor, respectively, said first transistor connected between the supply terminal and the output terminal of said first type of logic gate at a K-th ($1 \leq K \leq N$) stage of the N stages said second transistor connected between the ground terminal and the output terminal of said second type of logic gate at the K-th stage of the N stages, said first control signal being synchronized with the second type of logic gate at the K-th stage, said second control signal being synchronized with the high-to-low transition of the output signal of said first type of logic gate at the K-th stage.

17. A static logic circuit according to claim 11, wherein said first-type logic gates and said second-type logic gates in said first-type logic series are arranged in alternating cascade configuration, and said first-type logic gates and said second-type logic gates in said second-type logic series are arranged in alternating cascade configuration.

18. A static logic circuit comprising: a logic series formed by alternate cascade connection of a first type and a second type of logic gate, said first type of logic gate having a first and a second current path, a first and a second transistor, two output terminals for a pair of a first positive and a first negative-polarity output signal, a supply terminal, a ground terminal, said first and a second current path composed of a plurality of transistors to provide a logical function, having at least two input terminals for a pair of a positive and a negative-polarity input signal, and being connected between the ground terminal and the output terminal for the first positive and the first negative-polarity output signal respectively, said first transistor being connected between the supply terminal and the output terminal for the first positive-polarity output signal, a control electrode of said first transistor being connected to the output terminal for the first negative output signal, said second transistor being connected between the supply terminal and the output terminal for the first positive-polarity output signal, a control electrode of said second transistor being connected to the output terminal for the first positive-polarity output signal, said second type of logic gate having a third and a fourth current path, a third and a fourth transistor, two output terminals for a pair of a second positive-polarity output signal and a second negative-polarity output signal, said third and a fourth current path composed of a plurality of other transistors to provide a logical function, having at least two input terminals for a pair of a positive and a negative-polarity input signal, and being connected between the supply terminal and the output terminal for the second positive and the second negative-polarity output signal respectively, said third transistor being connected between the ground terminal and the output terminal for the second positive-polarity output signal, having a control electrode being connected to the output terminal for the second negative output signal, said fourth transistor being connected between the ground terminal and the output terminal for the second negative-polarity output signal, having a control being connected to the output terminal for the second positive-polarity output signal.

* * * * *